(12) United States Patent
Langlois et al.

(10) Patent No.: US 10,510,945 B1
(45) Date of Patent: Dec. 17, 2019

(54) MAGNETOELASTICALLY ACTUATED MEMS DEVICE AND METHODS FOR ITS MANUFACTURE

(71) Applicant: National Technology & Engineering Solutions of Sandia, LLC, Albuquerque, NM (US)

(72) Inventors: Eric Langlois, Albuquerque, NM (US); Christian L. Arrington, Albuquerque, NM (US); Patrick S. Finnegan, Albuquerque, NM (US); Andrew E. Hollowell, Albuquerque, NM (US); Jamin Ryan Pillars, Albuquerque, NM (US); Todd Monson, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 302 days.

(21) Appl. No.: 15/719,219

(22) Filed: Sep. 28, 2017

Related U.S. Application Data

(63) Continuation-in-part of application No. 14/876,652, filed on Oct. 6, 2015, now Pat. No. 10,132,699.

(Continued)

(51) Int. Cl.
*H01L 41/12* (2006.01)
*H01H 55/00* (2006.01)
(Continued)

(52) U.S. Cl.
CPC ............ *H01L 41/12* (2013.01); *B81B 3/0021* (2013.01); *B81C 1/0015* (2013.01); *C25D 1/003* (2013.01);
(Continued)

(58) Field of Classification Search
CPC ......... H01L 41/12; H01L 41/20; H01L 41/47; B81B 3/0021; B81B 2201/032;
(Continued)

(56) References Cited

U.S. PATENT DOCUMENTS

| | | |
|---|---|---|
| 4,053,373 A | 10/1977 | McMullen et al. |
| 4,208,254 A | 6/1980 | Mitsumoto et al. |

(Continued)

OTHER PUBLICATIONS

Suwa et al.; "Study of Strain Sensor Using FeSiB Magnetostrictive Thin Film"; Pub Date Feb. 2010; IEEE Transactions on Magnetics; vol. 46, No. 2; 666-669 (Year: 2010).*

(Continued)

*Primary Examiner* — Melissa J Koval
*Assistant Examiner* — Rahul Maini
(74) *Attorney, Agent, or Firm* — Martin I. Finston; Helen S. Baca

(57) ABSTRACT

A magnetoelastically actuated device includes a microscale cantilever arm supported at a standoff distance from a substrate. The cantilever arm is formed as a laminar magnetic actuator configured to bend when it is subjected to a magnetic field. The cantilever arm includes a film of magnetostrictive material. Also provided is a method for fabricating the magnetoelastically actuated device. The method includes defining an actuator mold in a layer of photoresist on a structural layer of the cantilever arm and electrodepositing a layer of a magnetostrictive alloy containing cobalt and iron onto the structural layer within the actuator mold.

11 Claims, 24 Drawing Sheets

Related U.S. Application Data

(60) Provisional application No. 62/060,275, filed on Oct. 6, 2014.

(51) Int. Cl.

| | |
|---|---|
| H01G 5/16 | (2006.01) |
| H01F 1/01 | (2006.01) |
| H02N 1/00 | (2006.01) |
| H03H 9/22 | (2006.01) |
| H03H 3/06 | (2006.01) |
| H01L 41/47 | (2013.01) |
| B81B 3/00 | (2006.01) |
| B81C 1/00 | (2006.01) |
| H01L 41/20 | (2006.01) |
| G02B 26/08 | (2006.01) |
| C25D 3/56 | (2006.01) |
| C25D 3/38 | (2006.01) |
| C25D 1/00 | (2006.01) |
| H01H 59/00 | (2006.01) |

(52) U.S. Cl.
CPC ............... *C25D 3/38* (2013.01); *C25D 3/562* (2013.01); *G02B 26/0825* (2013.01); *H01F 1/01* (2013.01); *H01G 5/16* (2013.01); *H01H 55/00* (2013.01); *H01H 59/0009* (2013.01); *H01L 41/20* (2013.01); *H01L 41/47* (2013.01); *H02N 1/006* (2013.01); *H03H 3/06* (2013.01); *H03H 9/22* (2013.01); *B81B 2201/032* (2013.01); *B81B 2203/0118* (2013.01); *B81C 2201/0105* (2013.01)

(58) Field of Classification Search
CPC ........... B81B 2203/0118; B81C 1/0015; B81C 2201/0105; C25D 1/003; C25D 3/38; C25D 3/562; G02B 26/0825; H01F 1/01; H01G 5/16; H01H 55/00; H01H 59/0009; H02N 1/006; H03H 3/06; H03H 9/22; G01R 33/20
USPC ......................................................... 324/209
See application file for complete search history.

(56) References Cited

U.S. PATENT DOCUMENTS

| | | | |
|---|---|---|---|
| 5,020,378 | A | 6/1991 | Hesthamer et al. |
| 5,297,439 | A | 3/1994 | Tyren et al. |
| 5,304,284 | A | 4/1994 | Jagannathan et al. |
| 5,317,223 | A | 5/1994 | Kiesewetter et al. |
| 5,551,158 | A | 9/1996 | Tyren et al. |
| 5,557,085 | A | 9/1996 | Tyren et al. |
| 5,576,693 | A | 11/1996 | Tyren et al. |
| 5,739,752 | A | 4/1998 | Tyren |
| 5,760,580 | A | 6/1998 | Tyren |
| 5,969,610 | A | 10/1999 | Tyren |
| 5,990,792 | A | 11/1999 | Tyren |
| 6,018,297 | A | 1/2000 | Tyren |
| 6,137,411 | A | 10/2000 | Tyren |
| 6,218,944 | B1 | 4/2001 | Kiesewetter et al. |
| 6,225,905 | B1 | 5/2001 | Tyren et al. |
| 6,232,879 | B1 | 5/2001 | Tyren |
| 6,285,286 | B1 | 9/2001 | Tyren et al. |
| 6,396,677 | B1 * | 5/2002 | Chua ........................ H01G 5/16 361/278 |
| 6,417,771 | B1 | 7/2002 | Tyren |
| 6,855,240 | B2 | 2/2005 | Cooper et al. |
| 7,075,439 | B2 | 7/2006 | Tyren et al. |
| 7,101,724 | B2 * | 9/2006 | Chou .................. B81C 1/00611 216/2 |
| 7,123,129 | B1 * | 10/2006 | Schrott ............. G06K 19/0723 340/10.1 |
| 7,345,866 | B1 | 3/2008 | Hsu et al. |
| 7,567,018 | B2 * | 7/2009 | Kawakubo ............ B81B 3/0021 200/181 |
| 7,933,112 | B2 | 4/2011 | Ayazi et al. |
| 7,943,116 | B1 | 5/2011 | Huber et al. |
| 8,168,120 | B1 * | 5/2012 | Younis ................. G01N 29/022 422/68.1 |
| 8,276,451 | B2 | 10/2012 | Tyren |
| 8,414,772 | B2 | 4/2013 | Tyren et al. |
| 8,425,749 | B1 | 4/2013 | Ravula et al. |
| 8,570,705 | B2 | 10/2013 | DeReus |
| 8,674,689 | B1 | 3/2014 | Nielson et al. |
| 8,726,730 | B1 | 5/2014 | Nielson et al. |
| 8,736,145 | B2 * | 5/2014 | Liu ....................... B81B 3/0072 310/26 |
| 8,783,106 | B1 | 7/2014 | Nielson et al. |
| 8,814,622 | B1 | 8/2014 | Resnick et al. |
| 2004/0150939 | A1 | 8/2004 | Huff |
| 2005/0161338 | A1 | 7/2005 | Fang et al. |
| 2006/0152313 | A1 * | 7/2006 | Zmood .................. G01K 1/024 335/208 |
| 2010/0243133 | A1 | 9/2010 | Kunishi et al. |
| 2011/0038093 | A1 | 2/2011 | Furukawa et al. |

OTHER PUBLICATIONS

U.S. Appl. No. 14/340,012, filed Jul. 24, 2014, Langlois et al.
U.S. Appl. No. 14/531,075, filed Nov. 3, 2014, Monson et al.
Amiri S et al., "The role of cobalt ferrite magnetic nanoparticles in medical science," *Mater. Sci. Eng. C* 2013;33(1):1-8.
Arndt M et al., "Coded labels with amorphous magnetoelastic resonators," *IEEE Trans. Magn.* 2002;38(5):3374-6.
Bedenbecker M et al., "Electroplated CoFe thin films for electromagnetic microactuators," *J. Appl. Phys.* 2006;99:08M308 (3 pp.).
Bonini M et al., "Nanostructures for magnetically triggered release of drugs and biomolecules," *Curr. Op. Colloid Interface Sci.* 2013;18(5):459-67.
Bozorth RM et al., "Anisotropy and magnetostriction of some ferrites," *Phys. Rev.* 1955;99:1788-98.
Brankovic SR et al., "The effect of $Fe^{3+}$ on magnetic moment of electrodeposited CoFe alloys—experimental study and analytical model," *Electrochim. Acta* 2008;53(20):5934-40.
Chen LQ, "Phase-field models for microstructure evolution," *Annu. Rev. Mater. Res.* 2002;32:113-40.
Clark AE et al., "Extraordinary magnetoelasticity and lattice softening in bcc Fe—Ga alloys," *J. Appl. Phys.* 2003;93(10):8621-3.
Du Trémolet de Lacheisserie et al., "Magnetostriction and internal stresses in thin films: the cantilever method revisited," *J. Magn. Magnetic Mater.* 1994;136(1-2):189-96.
Elhalawaty S et al., "Oxygen incorporation into electrodeposited CoFe films: consequences for structure and magnetic properties," *J. Electrochem. Soc.* 2011;158(11):D641-6.
Finnegan, P. et al., "Process Integration of Elctroformed MEMS Variable Capacitors for Magnetostriction Measurements", The Electrochemical Society. 2016, 3852.
Estrine EC et al., "Electrodeposition and characterization of magnetostrictive galfenol (FeGa) thin films for use in microelectromechanical systems," *J. Appl. Phys.* 2013;113:17A937 (3 pp.).
George J et al., "Oxide/hydroxide incorporation into electrodeposited CoFe alloys—consequences for magnetic softness," *Electrochim. Acta* 2013;110:411-7.
Gibbs MRJ et al., "Magnetic materials for MEMS applications." *J. Phys. D: Appl. Phys.* 2004;37(22):R237-44.
Grimes C et al., "Wireless magnetoelastic resonance sensors: a critical review," *Sensors* 2002;2:294 313.
Grimes CA et al., "Theory, instrumentation and applications of magnetoelastic resonance sensors: a review," *Sensors* (Basel) 2011;11(3):2809 44.
Hunter D et al., "Giant magnetostriction in annealed $Co_{1-x}Fe_x$ thin-films," *Nat. Commun.* 2011;2:article 518 (7 pp.).
Iannotti V et al., "Improved model for the magnetostrictive deflection of a clamped film-substrate system," *J. Magnetism Magnetic Mater.* 1999;202(1):191-6.

(56) References Cited

OTHER PUBLICATIONS

Ibarra MR et al., "Giant volume magnetostriction in the FeRh alloy," *Phys. Rev. B* Aug. 1994;50(6):4196-9.
Iselt D et al., "Electrodeposition and characterization of $Fe_{80}Ga_{20}$ alloy films," *Electrochim. Acta* 2011;56(14):5178-83.
Kakeshita T et al., "Magnetic field-induced martensitic transformation and giant magnetostrictions in Fe—Ni—Co—Ti and ordered $Fe_3Pt$ shape memory alloys," *Mater. Trans. JIM* 2000;41(8):882-7.
Kakuno EM et al., "Structure, composition, and morphology of electrodeposited $Co_xFe_{1-x}$ alloys," *J. Electrochem. Soc.* 1997;144(9):3222-6.
Koza JA et al., "The effect of magnetic fields on the electrodeposition of CoFe alloys," *Magnetohydrodynamics* 2009;45(2):259-66.
Koza JA et al., "The effect of magnetic fields on the electrodeposition of CoFe alloys," *J. Magnetism Magnetic Mater.* 2009;321:2265-8.
Lai Y et al., "Fabrication of patterned $CdS/TiO_2$ heterojunction by wettability template-assisted electrodeposition," *Mater. Lett.* 2010;64(11):1309-12.
Lallemand F et al., "Effects of the structure of organic additives in the electrochemical preparation and characterization of CoFe film," *Electrochim. Acta* 2002;47(26):4149-56.
Lallemand F et al., "Electrodeposition of cobalt-iron alloys in pulsed current from electrolytes containing organic additives," *Surf. Coatings Technol.* 2005;197(1):10-7.
Lallemand F et al., "Kinetic and morphological investigation of CoFe alloy electrodeposition in the presence of organic additives," *Surf. Coatings Technol.* 2004;179(2-3):314-23.
Langlois, E. et al., "Modeling and Characterization of Elctroformed MEMS Variable Capacitors for Cobalt Iron Magnetostriction Measurements", Prime 2016.
Liao Sh, "High moment CoFe thin films by electrodeposition," *IEEE Trans. Mag.* 1987;23(5):2981-3.
Liu X et al., "Electrodeposited Co—Fe and Co—Fe—Ni alloy films for magnetic recording write heads," *IEEE Trans. Mag.* 2000;36(5):3479-81.
Liu X, "Electrodeposition of soft, high moment Co—Fe—Ni thin films," *J. Appl. Phys.* 2000;87(9):5410-2.
Luharuka R et al., "Improved manufacturability and characterization of a corrugated Parylene diaphragm pressure transducer," *J. Micromech. Microeng.* 2006;16:1468-74.
Meeks SW et al., "Piezomagnetic and elastic properties of metallic glass alloys $Fe_{87}CO_{18}B_{14}Si_1$ and $Fe_{81}B_{13.5}Si_{3.5}C_2$," *J. Appl. Phys.* 1983;54(11):6584-93.
Mishra AC, "Microstructure, magnetic and magnetoimpedance properties in electrodeposited NiFe/Cu and CoNiFe/Cu wire with thiourea additive in plating bath," *Physica B—Condensed Matter* 2012;407(6):923-34.
Monson, T. et al., "Highly magnetostrictive electrodeoposited CoFe materials and devices", 2016, SAND2016-0239C, Sandia National Laboratories.
Monson, T. et al., "Highly magnetostrictive electrodeposited CoFe for smart tags and sensors", 2016, SAND2016-2199C.

Osaka T et al., "A high moment CoFe soft magnetic thin film prepared by electrodeposition," *Electrochem. Solid State Lett.* 2003;6(4):C53-5.
Pillars JR et al., "Controlling CoFe electrodeposited film properties for improved magnetostriction," *ECS and SMEQ Joint International Meeting*, held on Oct. 4-9 at Cancun, Mexico, presentation (21 pp.).
Pillars JR et al., "Controlling crystal structure and stoichiometry in Co/Fe electrodeposited films for improved magnetostriction," *ECS and SMEQ Joint International Meeting*, held on Oct. 4-9 at Cancun, Mexico, abstract No. MA2014-02 920 (2 pp.).
Pillars, J. et al., "Electrodeposition of High Magnetostrictive Cobalt Iron Alloy Films for Smart Tags and Sensor Applications", Nanoscience and Microsystems ETDS, 2016.
Quandt E et al., "Preparation and applications of magnetostrictive thin films," *J. Appl. Phys.* 1994;76:7000-2.
Quandt E, "Giant magnetostrictive thin film materials and applications," *J. Alloys Compounds* 1997;258(1-2):126-32.
Sartale SD et al., "Electrochemical synthesis of nanocrystalline $CuFe_2O_4$ thin films from non-aqueous (ethylene glycol) medium." *Mater. Chem. Phys.* 2003;80(1):120-8.
Schmuki P et al., "Selective electrodeposition of micropatterns on predefined surface defects on p-Si(100)," *J. Electrochem. Soc.* 2001;148(3):C177-182.
Shao I et al., "Stress in electrodeposited high moment CoFe films," *ECS Trans.* 2010;25(34):35-43.
Snodgrass JD et al., "Optimized TERFENOL-D manufacturing processes," *J. Alloys Compounds* 1997;258(1-2):24-9.
Tam AC et al., "A new high-precision optical technique to measure magnetostriction of a thin magnetic-film deposited on a substrate," *IEEE Trans. Magnet.* 1989;25(3):2629-38.
Tang J et al., "Miniaturized magnetoelastic tags using frame-suspended hexagonal resonators," 27th Int. Conf. on Microelectromechanical Systems, held on Jan. 26-30, 2014 in San Francisco, CA, pp. 76-79.
Tang J et al., "Scalable, high-performance magnetoelastic tags using frame-suspended hexagonal resonators," *J. Micromech. Microeng.* 2014;24:065006 (8 pp.).
Wang L et al., "Facile synthesis and electromagnetic wave absorption properties of magnetic carbon fiber coated with Fe—Co alloy by electroplating," *J. Alloys Compounds* 2011;509(14):4726-30.
Yokoshima Y et al., "Micropattern formation for magnetic recording head using electroless CoFeB deposition," *J. Electrochem. Soc.* 2002;149(8):C375-82.
Zeng KF et al., "Time domain characterization of oscillating sensors: application of frequency counting to resonance frequency determination," *Rev. Sci. Inst.* Dec. 2002;73:4375-80.
Zhang JX et al., "Phase-field microelasticity theory and micromagnetic simulations of domain structures in giant magnetostrictive materials," *Acta Materialia* 2005;53:2845-55.
Zong by et al., "Ultrasoft and high magnetic moment NiFe film electrodeposited from a $Cu^{2+}$ contained solution," *IEEE Trans. Magnet.* 2006;42(10):2775-7.

\* cited by examiner

MAGNETOELASTICALLY ACTUATED MEMS DEVICE AND METHODS FOR ITS MANUFACTURE

CROSS-REFERENCE TO RELATED APPLICATIONS

This application is a continuation-in-part of U.S. application Ser. No. 14/876,652, filed Oct. 6, 2015, which claims the benefit of U.S. Provisional Application 62/060,275, filed Oct. 6, 2014. Each of the abovesaid applications is hereby incorporated herein by reference in its entirety.

The subject matter of this application is related to the subject matter of the commonly owned application Ser. No. 15/718,678, which was filed on the filing date hereof under the title, "Sensor Device Using A Magnetostrictive Resonator".

STATEMENT OF GOVERNMENT INTEREST

This invention was made with Government support under contract no. DE-AC04-94AL85000 awarded by the U.S. Department of Energy to Sandia Corporation. This invention was made with Government support under Contract No. DE-NA0003525 awarded by the United States Department of Energy/National Nuclear Security Administration. The Government has certain rights in the invention.

FIELD OF THE INVENTION

The present invention relates to microscale magnetoelastic devices for use as sensors or actuators, as well as to methods for making such devices.

BACKGROUND OF THE INVENTION

Radiofrequency (RF) tags and sensors are frequently used in national security applications, but radiofrequency sensing has numerous limitations. For instance, RF cannot penetrate metallic barriers and cannot be used in harsh environments (e.g., in water, in underground repositories, or in the presence of shelving). For safety reasons, RF cannot be used in the presence of high explosives. There are also operational hurdles, where RF tags and sensors can interfere with communications and are vulnerable to long-range interrogation by adversaries. Thus, the use of RF-based technologies can be limited for various technological, operational, or safety reasons.

Magnetoelastic tags are an alternative technology and are a familiar security measure used in stores to prevent theft. Current magnetoelastic tags are large, single frequency devices cut from strips of an amorphous magnetic material, such as Metglas®, having relatively low magnetostriction (e.g. about 12 to 30 ppm, depending on composition). These tags are typically used to announce when the tag is magnetically activated, e.g., when passing through a portal. However, the information conveyed is generally limited to an "on" or "off" response.

Magnetoelastic materials can also be used to sense a condition such as a structural flaw or a defect in a building or an aircraft. Such applications, however, are limited by a lack of commercially available materials that have high magnetostriction and are capable of providing multiplexed signals.

Accordingly, there is a need for tags and sensors that can operate in various harsh or enclosed environments, while providing multiplexed responses. Alternatives to present RF and magnetoelastic technologies having enhanced functionality and lower manufacturing costs would greatly advance tagging and sensing modalities.

SUMMARY OF THE INVENTION

The present invention relates to microfabricated magnetic devices for tagging, actuation, and sensor applications. In some embodiments, resonators are provided that can respond with a unique combination of multiple resonance frequencies.

Recently, giant magnetostriction has been observed in CoFe thin films fabricated by sputter deposition (Hunter D et al., "Giant magnetostriction in annealed $Co_{1-x}Fe_x$ thin-films," *Nat. Commun.* 2011; 2: article 518), a technique often used in microfabrication. Deposition by sputtering, however, suffers the drawbacks of high intrinsic material stress, slow deposition rates, and a lack of anisotropic etch processes for patterning the deposited material.

Resonant devices according to an aspect of the present invention can provide numerous benefits. The resonator may be safely interrogated near high explosives and through barriers, where RF-based tags and sensors cannot be used. In addition, resonant frequencies can be controlled and designed because the electrodeposition process allows for micropatterning of resonator dimensions that determine the resonant frequencies.

Sensors, according to another aspect of the invention, can provide in situ monitoring of magnetic fields, and by the same token, monitoring of electric currents that give rise to those magnetic fields. The sensor can operate in place without a power source of its own, and without drawing power parasitically from the system it is monitoring. Moreover, the sensor can be interrogated remotely, thus obviating the need for teardown or for difficult or time-consuming direct physical access.

Accordingly, the present invention in various of its aspects relates to microfabricated devices that comprise an electrodeposited, magnetostrictive alloy film containing cobalt and iron. (Such a film will be referred to generally, below, as a CoFe film even if it contains additional elements beyond cobalt and iron.)

In one aspect, the present invention relates to a method of electrodeposition of such a film from a plating solution (e.g., an aqueous plating solution). Exemplary constituents of such a solution include a cobalt source (cobalt sulfamate, cobalt sulfate, and/or cobalt chloride, as well as salts or hydrates thereof); an iron source (e.g., iron tetrafluoroborate, ammonium ferrous sulfate, iron sulfate, iron chloride, iron sulfamate, as well as salts or hydrates thereof); two or more oxygen scavengers; one or more surfactants; and one or more grain refiners.

In another aspect, the present invention relates to methods of making resonators or magnetically actuated devices comprising an electrodeposited magnetostrictive material containing cobalt and iron. In some embodiments, the magnetostrictive material has a large magnetostriction value (e.g., a saturation value $\lambda_{sat.}$ of magnetostrictive strain greater than about 100 ppm and/or a saturation magnetization $M_{sat.}$ greater than about $1.5 \times 10^{-6}$ A/m) and is capable of forming multi-frequency tags and sensors. In particular, batch fabrication via electrodeposition can reduce cost and be more conducive towards developing chip-level sensor device architectures.

Accordingly, the invention in some embodiments relates to a magnetoelastically actuated device that includes a microscale cantilever arm supported at a standoff distance from a substrate. The cantilever arm is formed as a laminar magnetic actuator configured to bend when it is subjected to a magnetic field. The cantilever arm includes a film of magnetostrictive material.

The invention in some other embodiments relates to a method for fabricating the magnetoelastically actuated device. The method includes defining an actuator mold in a layer of photoresist on a structural layer of the cantilever arm and electrodepositing a layer of a magnetostrictive alloy containing cobalt and iron onto the structural layer within the actuator mold.

Definitions

As used herein, the terms "top," "bottom," "upper," "lower," "above," "beneath," and "below" are used to provide a relative relationship between structures. The use of these terms does not indicate or require that a particular structure must be located at a particular location in the apparatus, resonator, resonator array, or system.

As used herein, the term "about" means +/−10% of any recited value. As used herein, this term modifies any recited value, range of values, or endpoints of one or more ranges.

As used herein, the prefix "micro", the term "micron-sized", or the term "microstructured" means that the structure has at least one dimension less than 1000 µm. Exemplary dimensions in this regard include length, width, height, thickness, circumference, and the like.

As used herein, the term "resonator portion" means a resonating structure having a length $L_n$ along an axis in. As described herein, the resonator of the invention can have one or more resonator portions in any useful geometry or configuration. When a plurality of resonator portions is present, each portion may be a free-standing structure. In addition, each portion may be a planar film disposed on a surface. Alternatively, each portion can be integrated into a single structure sharing one or more common vertices. Additional descriptions of resonator portions are described herein.

BRIEF DESCRIPTION OF THE DRAWINGS

(FIG. 2) a multi-frequency resonator 20 having three resonator portions 21 having lengths $L_1$, $L_2$, and $L_3$ along axes 1, 2, and 3, respectively, in the xy plane, where three possible frequencies can be detected in this exemplary resonator; and (FIG. 3) a substrate 30 lacking a resonator but optionally including a post 32. The resonator portions can be of any useful size (e.g., from microns to centimeters in diameter) and geometry. In FIG. 2, angles $\alpha_2$ and $\alpha_3$ describe the radial position of axes 2 and 3, respectively, relative to main axis 1.

(FIG. 4) One exemplary method 100 includes an etch step 106 to release the resonator. (FIG. 5) Another exemplary method 200 includes separate steps to etch 203 a post and then to pattern the resonator 208. (FIG. 6) Yet another exemplary method 300 includes steps to electrodeposit 303, 307 a material to form the resonator portion and then to optionally affix 310 the resonator to a substrate.

DETAILED DESCRIPTION OF THE INVENTION

Figure 1:
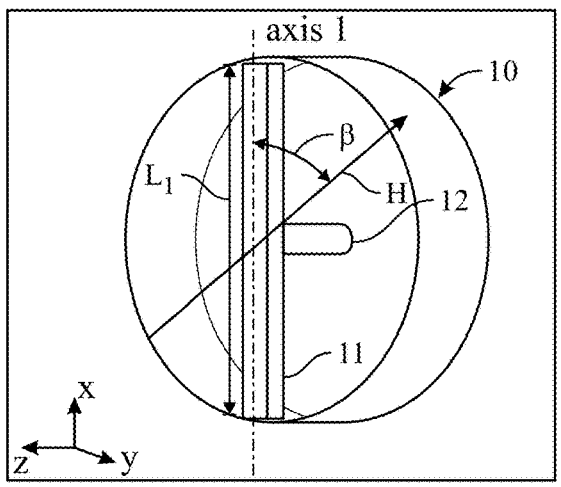
FIGS. 1-3 show schematic views of (FIG. 1) a single frequency resonator 10 having a resonator portion 11 with length $L_1$ along axis 1, where H is the magnetic field vector and β is the angle between the resonator main axis (i.e., axis 1 in the xy plane for this figure) and H.

A magnetoelastic resonator generates an AC magnetic response signal when subjected to an externally applied AC magnetic interrogation signal. The resonating structure can include a planar film. Alternatively, the resonating structure can include one or more resonating structures (e.g., resonator portions). Such resonating structures respond to an applied magnetic field. In FIG. 1, the resonator portion 11 is a rectangular prism whose length L and magnetic bias angle f determines its resonance frequency. When activated by an externally applied AC magnetic field, the resonating structures vibrate mechanically due to the Joule effect (i.e., the material strain induced by an applied magnetic field known as magnetostriction). Upon removal of the interrogation signal, the resonator continues to vibrate, generating its own AC magnetic response signal detectable by the same external antenna.

Figure 2:
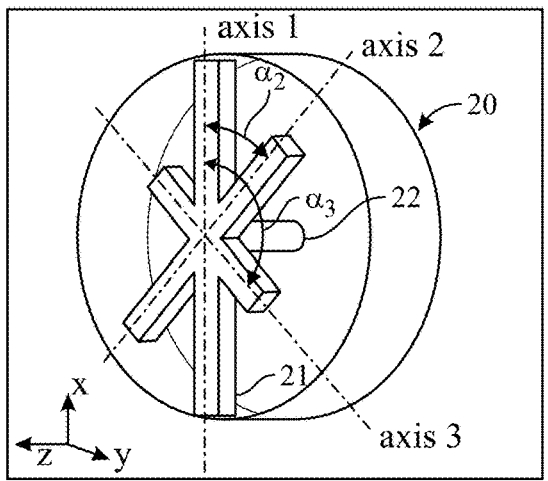

In one embodiment, the resonator includes one or more resonator portions and a substrate to affix each portion in a particular orientation. Each portion can be a freestanding structure. For instance, as shown in FIG. 1, the resonator portion 11 is an elongated bar having length $L_1$, and this structure is free-standing (albeit connected to a substrate via a post 12). Alternatively, each portion can be integrated into a single structure sharing one or more common vertices. For instance, as shown in FIG. 2, the resonator 20 has three resonator portions 21, each along axis 1, 2, and 3 in the xy plane. Each of the portions has a length L, along an axis n (e.g., portion 1 has length $L_1$ along axis 1, portion 2 has length $L_2$ along axis 2, etc.). In addition, each portion intersects at the midpoint of each $L_n$ at a common vertex. As shown in FIG. 2, this intersection provides a single structure having a star-shaped, multi-pronged shape. The center of this structure is then connected to a substrate in any useful manner, e.g., via a post 22 (as seen in FIG. 2).

It will be understood accordingly that FIG. 1 shows a 3-D model of a single frequency resonator 10, and that FIG. 2 shows a multi-frequency resonator 20.

Each resonator portion can have any useful shape having one or more length dimensions $L_n$ along axis n. Exemplary shapes include an elongated bar, a square (e.g., a square film), a rectangle (e.g., a rectangular bar), a toroid, a circle, a cylinder, an annulus, a ring, an ellipsoid, a cone, a planar thin film, etc. In some embodiments, the resonator portion is a rectangular bar. Without wishing to be limited by mechanism, a rectangular bar may be particular useful to maintain the desired shape anisotropy for the resonator.

Each resonator portion can have any useful dimensions, including length L having any useful value (e.g., from about 0.1 μm to about 10 cm).

The resonator portion can have any useful thickness (i.e., in the z-direction), e.g. a thickness in the range 5-250 μm.

Exemplary resonance frequencies include from about 20 to about 80 kHz.

Resonators can be implemented in arrays of multiple resonators of varying lengths and magnetic bias angles. This can provide a multi-frequency signal that serves as an address, i.e. as a unique identifier, for that array.

Figure 3:
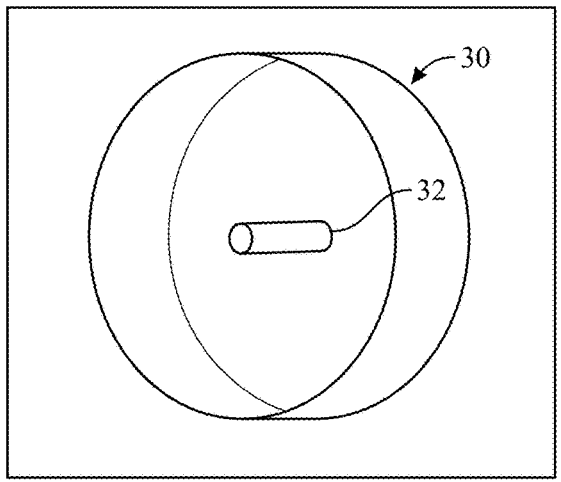

FIG. 3 shows a 3-D model of a resonator post 32, in which the CoFe resonators have been sheared off.

The substrate for the resonator, sensor, or device can be any useful material. In particular embodiments, the substrate is configured to support the resonator portion(s) in a particular configuration, while permitting mechanical oscillations with limited dampening. In other embodiments, the substrate include an interface (e.g., a post) configured to attach to the resonator portion(s) and to allow vibration of the resonator portion(s). Exemplary materials for the substrate include a polymer (e.g., polystyrene), a silicon or SOI wafer, a metal, or glass, optionally including one or more damping layers (e.g., an electrostatic coating, a polymer coating, and/or a coating include one or more particles or fibers). In other embodiments, the substrate can include a seeding layer (e.g., a copper layer) to assist in electrodeposition of the magnetostrictive material.

In some embodiments, the invention includes a microfabricated, patterned array of suspended magnetoelastic longitudinal mode resonators integrated with a permanent biasing magnet to achieve the optimal magnetoelastic operating point.

Cobalt and Iron Alloys

The present invention relates to CoFe films as defined above. In the specific case wherein other alloying metallic elements are excluded, the film may be referred to herein as a $Co_xFe_y$ film. The $CoFe_y$ film can possess any of various stoichiometric ratios of x and y. For instance, in some embodiments, x is of from about 60 at. % to 85 at. %, and y is of from about 15 at. % to 40 at. %. In another instance, x is of from about 70 at. % to 80 at. %, and y is of from about 20 at. % to 30 at. %.

The use of the term "$Co_xFe_y$" does not preclude the presence of other useful additives in the film. Exemplary additives include, without limitation, the oxygen scavengers ascorbic acid and trimethylamine borane (TMAB).

The film is electrodeposited from an aqueous plating solution. The solution includes one or more electrolytes such as boric acid. In an example, the various constituents of the plating solution are added sequentially: The electrolyte is added first, and then the cobalt source is added with any desired additive. Then, the pH is adjusted, and the iron source is added as the last component. In some embodiments, the pH is maintained at a low value (e.g., less than about 3). Although use of low pH can result in iron oxidation and increased deposit stress, we have discovered that uninterrupted purging of the bath with an inert gas, combined with the inclusion in the bath of an oxygen scavenger, leads to films with low oxygen content. In addition, we found that we could suppress the formation of iron deposits by maintaining a long enough "off" phase in the duty cycle to ensure sufficient oxygen scavenging.

In examples, the films are electrodeposited with "giant magnetostriction", defined herein as a $\lambda_{sat.}$ of more than 100 ppm. In examples, the film is a $Co_{0.66}Fe_{0.34}$ film that was annealed for 1 hour at 800° C. and water-quenched. In other examples, the film is a $Co_xFe_y$ film that is not annealed but still possesses $\lambda_{sat.}$ of more than 100 ppm.

Without wishing to be limited by mechanism, we currently believe that cobalt-rich precipitates are formed via the high temperature anneal and water quenching process. We believe that magnetic reorientation of these precipitates in a film deposited near the (fcc+bcc)/bcc phase boundary for the Co/Fe system can give rise to giant magnetostriction.

The electrodeposition process typically includes immersing a surface in plating solutions under particular operating conditions, such as temperature, bath pH, counter electrode selection, agitation, current mode, and current density. Example constituents (without limitation) are listed below.

An example cobalt source or combination thereof includes one or both of $CoSO_4 \cdot 7H_2O$ and $Co(SO_3NH_2)_2$.

An example iron source or combination thereof includes one or more of $FeSO_4 \cdot 7H_2O$, $Fe(NH_4)_2(SO_4)_2$, and $FeCl_3$.

An example buffer or combination thereof includes one or more of $H_3BO_3$, 2-picoline, 2,6-lutidine, and acetic acid.

An example salt or combination thereof includes one or more of $CaCl_2$, NaCl, and $VOSO_4$.

An example acid or combination thereof includes one or more of acetic acid, succinic acid, glutaric acid, methylsuccinic acid, mannitol, and sorbitol.

An example grain refiner or combination thereof includes one or more of saccharin, thiourea, thiodiglycolic acid, an aromatic sulfinic acid, and a salt thereof such as a benzenesulfinate salt.

An example oxygen scavenger or combination thereof includes one or more of ascorbic acid and trimethylaminoborane.

An example surfactant is sodium lauryl sulfate.

An example configuration of electrodes includes one or more vertical electrodes of pure Co, one or more counter-electrodes of Pt, one or more working electrodes of Cu, and one or more Ag/AgCl saturated reference electrodes.

The bath is exemplarily held at a constant temperature in the range 25° C. to 60° C., e.g. at about 50° C.

The pH should be in the range 2.0 to 3.5.

The bath should be agitated, e.g. in the range from about 100 rpm to 400 rpm.

An applied magnetic field is desirable in order to induce uniaxial anisotropy in the deposition plane.

A rotating cathode such as a rotating copper disk electrode, is typically used.

To prevent nucleation, it is advantageous to deposit on a non-nucleating plate surface such as a Cu/NiP surface, a glass/Ti surface, a Cu/Si surface, Cu foil, NiFe/NiCr/glass surface, or an NiFe/Si surface having one or more of amorphous NiP, NiFe, or Cu.

The current is delivered in galvanostatic pulsed mode, at a density in the range from about 4 $mA/cm^2$ to 50 $mA/cm^2$, preferably about 40 $mA/cm^2$.

A dual cell system is typical, including cathode and anode cells separated by a salt bridge.

The waveform of the galvanostatic pulse train is characterized by an "on" state and an "off" state. The time duration of the "on" state can be used to promote the kinetically controlled reaction within the plating bath and to minimize the mass transfer limited reaction. In examples, the time duration of the "on" state is of from about 1 to 5 seconds (e.g., of from about 2 to 3 seconds). The time duration of the "off" state can be chosen to ensure that the bulk concentrations of the cobalt and iron sources are restored. In examples, the time duration of the "off" state is of from about 1 to 5 seconds (e.g., about 3 seconds).

The current density of the pulsed or direct current can be chosen to provide the desired stoichiometric ratio, or range of ratios, of the final film. In examples, the desired ratio is about 70 at. % to 80 at. % cobalt and about 20 at. % to 30 at. % iron, and the current density is more than about 30 $mA/cm^2$ (e.g., of from about 30 $mA/cm^2$ to 80 $mA/cm^2$, such as of from about 40 $mA/cm^2$ to 60 $mA/cm^2$).

After electrodeposition, the resultant material can optionally undergo further processing, such as annealing, furnace cooling (e.g., at a rate of about 10° C./minute), directional solidification, and/or rapid quenching (for example by water at room temperature).

Electrodeposition processes offer numerous benefits relative to other deposition methods. For instance, electrodeposition allows for in situ patterning via photoresist mold processes; broad range of thickness are possible (e.g., from 1 μm to 1 mm), and order of magnitude faster deposition rate (as compared to sputtering); lower intrinsic material stress; and lower capital cost, as compared to sputtering.

For embodiments that employ a magnetoelastic resonator, the above-described electrodeposition process may be used to form one or more resonator portion on a substrate. The substrate is then etched around the resonator portion(s).

Figure 4:
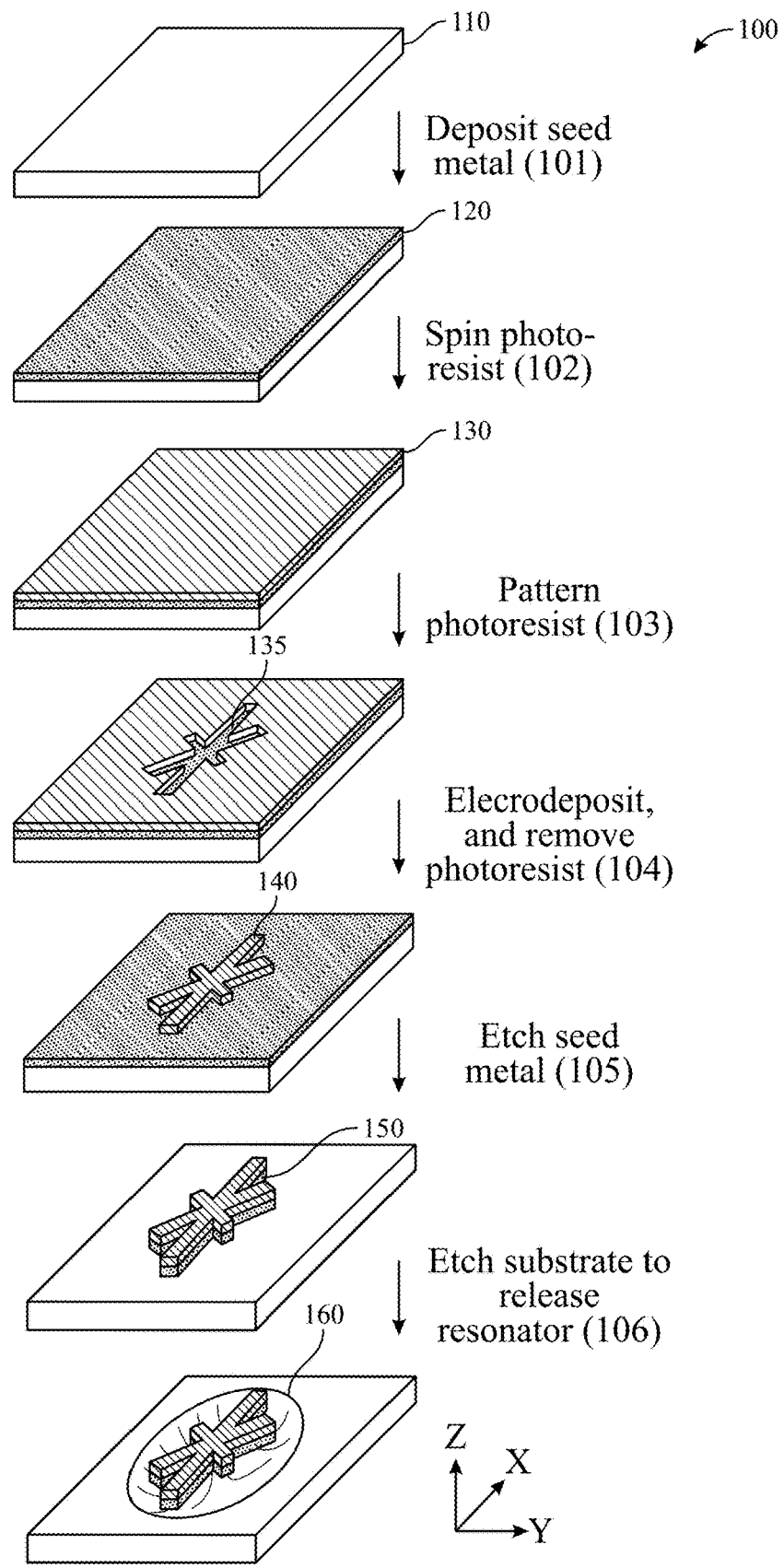
FIGS. 4-6 provide schematic views of exemplary methods to form resonator portions of a microfabricated magnetic resonator.

An exemplary process 100 is provided in FIG. 4. First, a surface 110 is provided to deposit 101 a layer of seed metal 120 (e.g., Cu). Then, a layer of photoresist 130 is deposited 102 on the seed metal. Next, the photoresist is patterned 103 (e.g., by any useful method, such as those provided herein) to include a micropattern 135 configured to receive one or more components of the magnetostrictive material (e.g., a cobalt source, an iron source, and any optional additive). One or more such components are electrodeposited 104 in the micropattern to form the resonator portions 140 (e.g., by placing the substrate in a plate solution containing such components).

Then, the seed metal layer is etched 105, thereby providing a residual metal layer 150 beneath the resonator portions 140. Finally, the substrate is etched 106 to provide an opening 160 (e.g., by any useful method, such as those provided herein), thereby releasing the resonator and allowing the resonator portions to vibrate freely. In some instances, the etching process releases the resonators but maintains an interface configured to affix the resonator portions to the substrate. Non-limiting interfaces include an etched post that affixes the resonator portions to the substrate.

Figure 5:
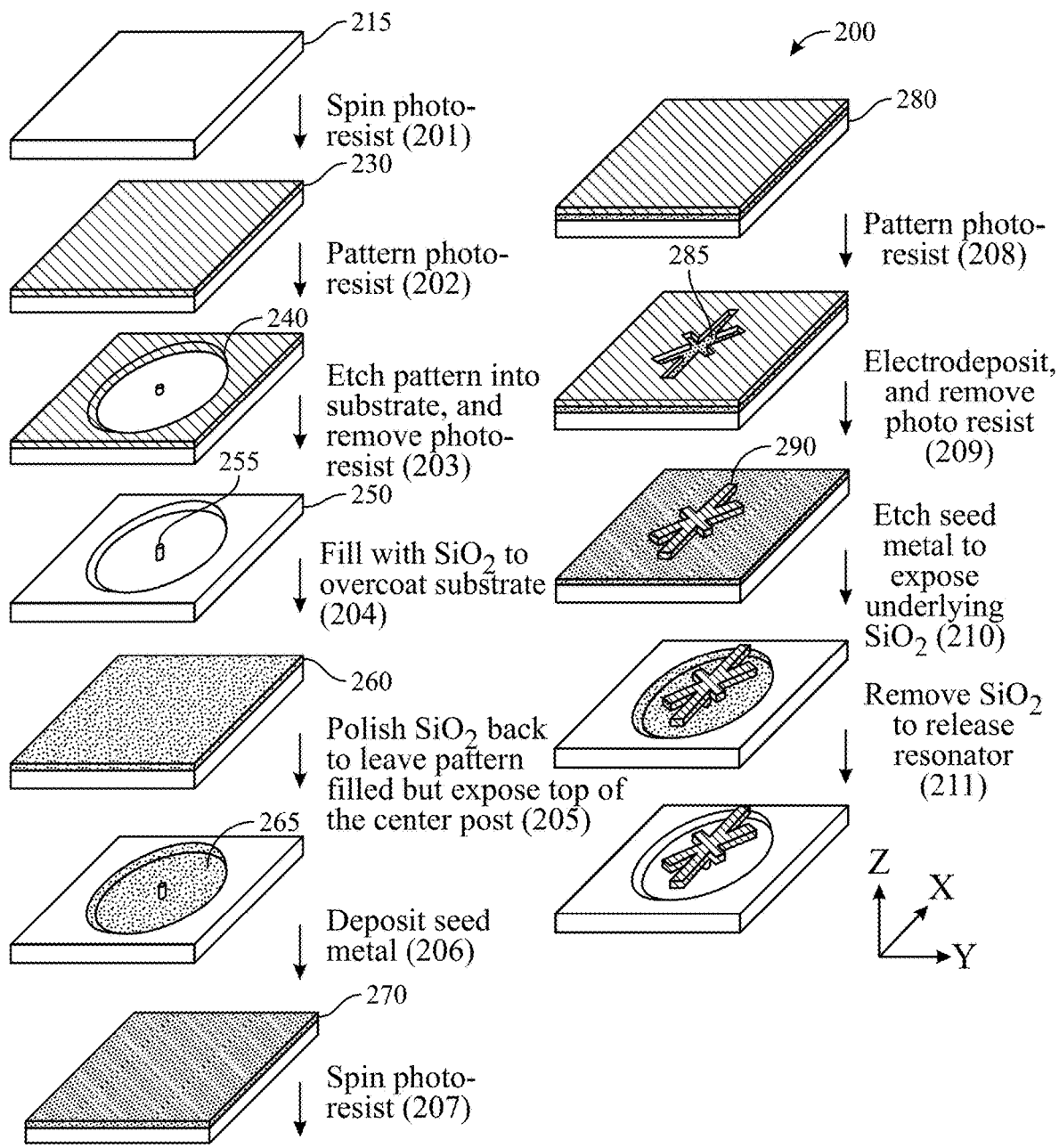

In other embodiments, the substrate is first patterned to include one or more microstructures, and then the resonator portion(s) are formed on the substrate. An exemplary process 200 is provided in FIG. 5. First, a layer of photoresist 230 is deposited 201 on the surface 215. Next, the photoresist is patterned 202 (e.g., by any useful method, such as those provided herein) to include a micropattern 240 configured to provide a micromold on the surface. The pattern is etched 203 into the substrate, and then photoresist is removed 203 to provide a substrate 250 (e.g., a micromold) optionally having an interface configured to attach to the resonator portion(s) (e.g., a post 255).

Then, the micromold is filled 204 with a sacrificial layer 260 (e.g., an $SiO_2$ layer) to overcoat the substrate. The sacrificial layer is polished back 205 to leave the patterned surface filled with the sacrificial layer 265 but to expose the surface of the post 255. A layer of seed metal 270 is deposited 206, and then a second layer of photoresist 280 is deposited 207 on the seed metal. The photoresist is patterned 208 (e.g., by any useful method, such as those provided herein) to include a micropattern 285 configured to receive one or more components of the magnetostrictive material (e.g., a Co cation source and an Fe cation source). One or more such components are electrodeposited 209 in the micropattern to form the resonator portions 290. Then, the seed metal layer is etched 210 to expose the underlying sacrificial layer. Finally, the surface is etched (e.g., by any useful method, such as those provided herein) to remove 211 the sacrificial layer and to release 211 the resonator, thereby allowing the resonator portions to vibrate freely. In some instances, the etching process releases the resonators but maintains an interface configured to affix the resonator portions to the substrate.

The methods of the invention also include any methods including electrodeposition to form the resonator portion(s).

Figure 6:
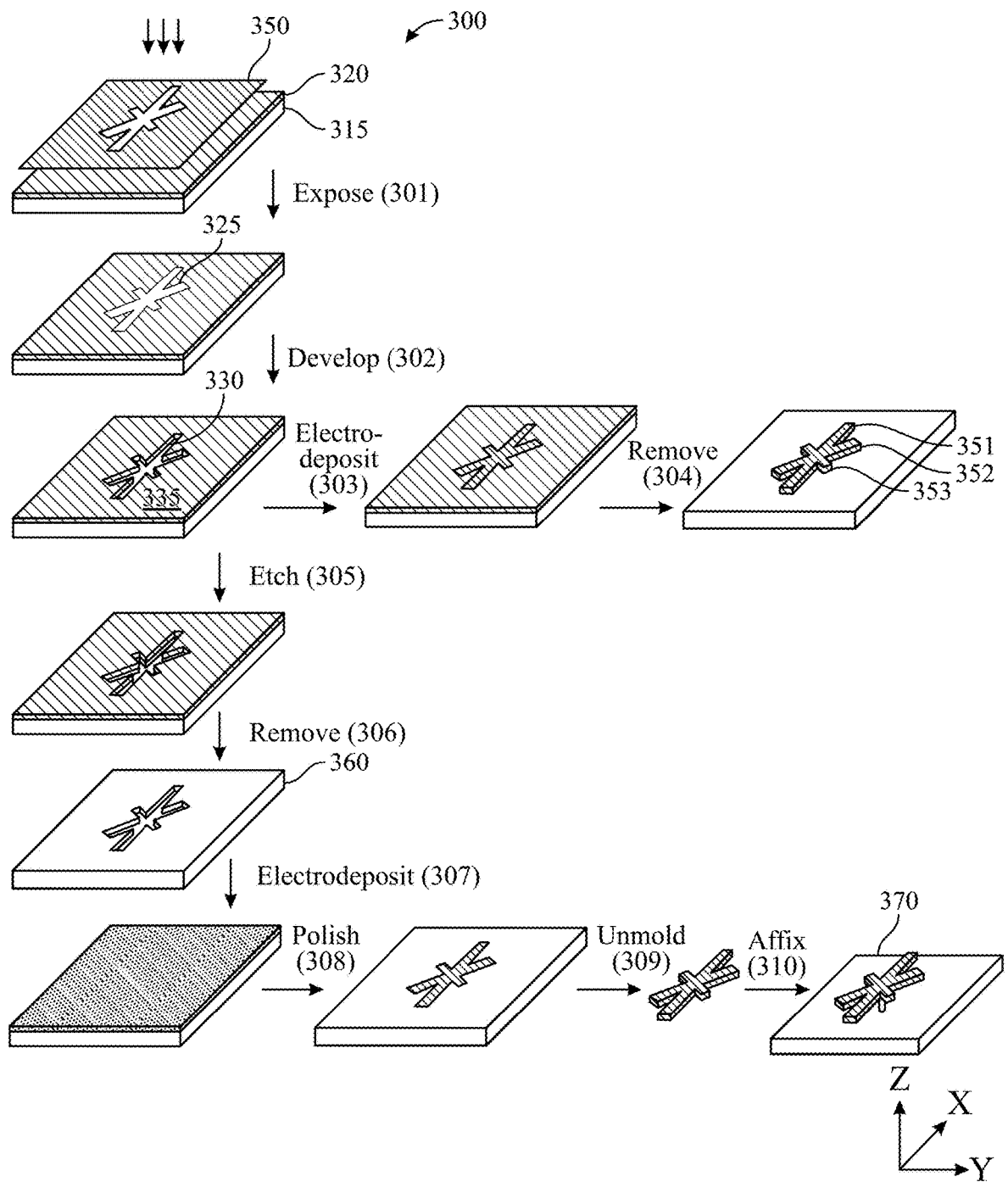

As seen in the process 300 of FIG. 6, first, a surface 315 having a layer of photoresist 320 is exposed 301 to a photomask 350 including a micropattern (the white portion of the photomask) that allows for UV transmission. In particular, the micropattern defines the geometry and configuration of the resonator portion(s) in the xy plane of the resonator (see FIG. 1 for the definition of the xy plane). UV light is then transmitted through the micropattern to crosslink the photoresist.

Next, the exposed surface is developed 302. As seen in FIG. 6, the photoresist is a positive tone resist, in which the UV-exposed portion 325 of the resist is more soluble to the developing solvent, as compared to the masked portion of the resist. Thus, after developing, the resulting surface includes a first area including photoresist 335 and a second area lacking the photoresist 330. Although FIG. 6 describes use with a positive tone resist, a skilled artisan would understand that negative tone resists can also be employed. Such negative tone resists, after UV exposure, are less soluble to the developing solution, as compared to before UV exposure. Thus, the photomask can be adapted to provide the micropattern as a negative image (i.e., where the portion of the photomask including the micropattern blocks UV transmission).

In one embodiment, the developed surface is then used for the electrodeposition process 303 (see, e.g., the top portion of FIG. 6). The magnetostrictive material is deposited within the second area (or micropattern) 330, and then the photoresist is removed 304. Optionally, the surface can be polished or machined to remove excess magnetostrictive material. The resultant resonator portions 351, 352, 353 can optionally be removed from the surface 315 and affixed to another substrate. Alternatively, the resonator portions can be maintained on the surface 315, and the surface can serve as the substrate for the resonator. For instance, the substrate can be etched to allow release the resonator portions, thereby allowing these portions to vibrate freely. In some instances, the etching process releases the resonators but maintains an interface configured to affix the resonator portions to the substrate.

In another embodiment, the developed surface is then further processed to form a micromold (see e.g., bottom portion of FIG. 6). The second area 330 is etched 305 (e.g., by a DRIE process) to remove a portion of the surface underlying this second area. Then, the photoresist layer 335 is removed 306, thereby providing a micropatterned mold (micromold) 360. Optionally, the surface of the micromold is polished by thermally growing $SiO_2$, thereby providing a surface that facilitates removal of the electrodeposited layer. Alternatively, one or more sacrificial layers or release layers may be used as well.

Then, one or more components of the magnetostrictive material is electrodeposited 307 on the micromold. Optionally, the electrodeposited surface can be micromachined or micropolished 308 to remove excess material. Next, the micropatterned resonator portions can be unmolded 309 (alternatively, as described herein, the substrate can be etched to release the resonator portions). Finally, if desired, the resonator portions can be affixed 310 on a substrate 370 to form the resonator.

Figure 7:
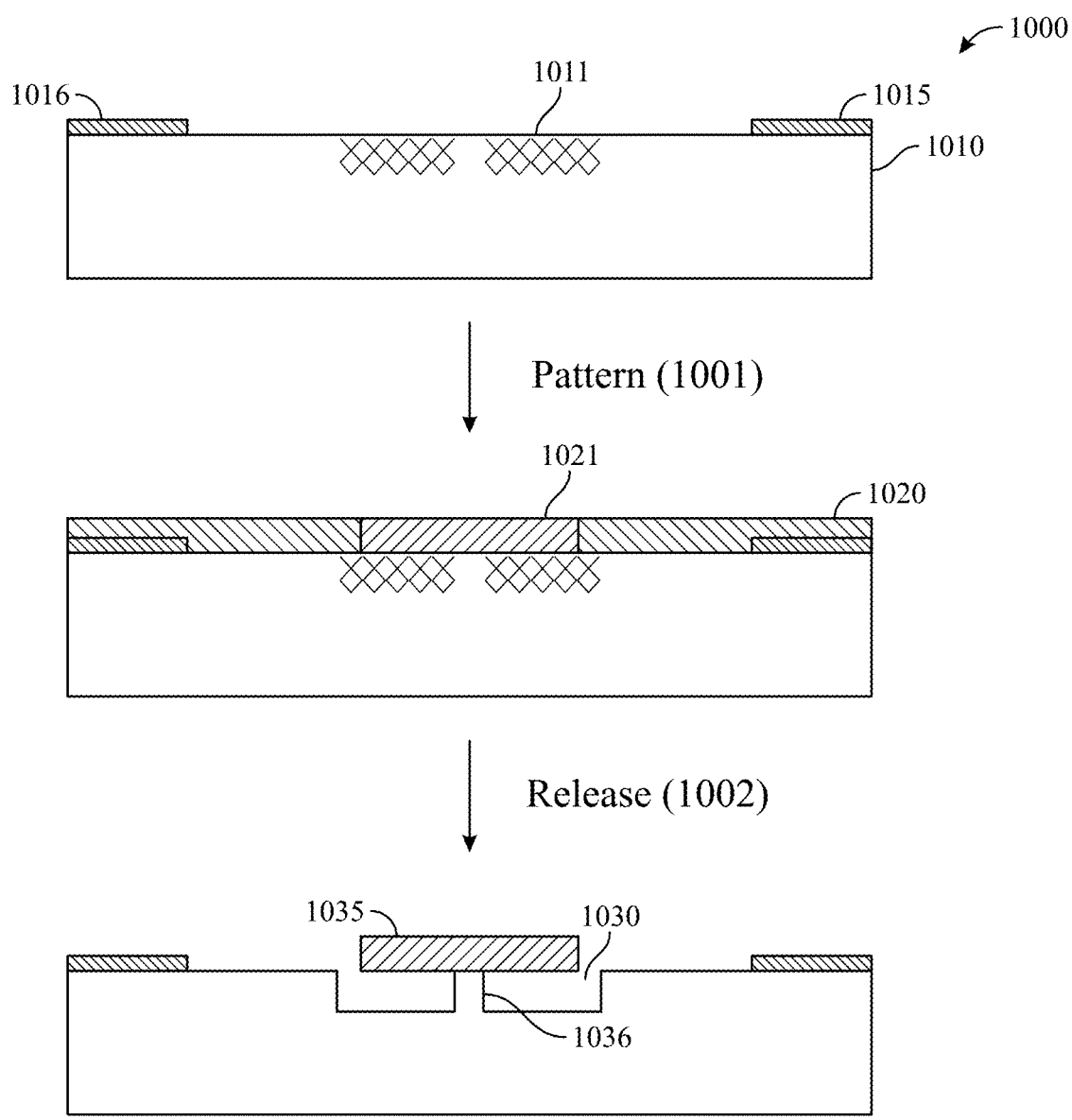
FIG. 7 shows a schematic of an exemplary method 1000 to form a microfabricated magnetic resonator disposed on an etchable substrate 1010.
Figure 8:
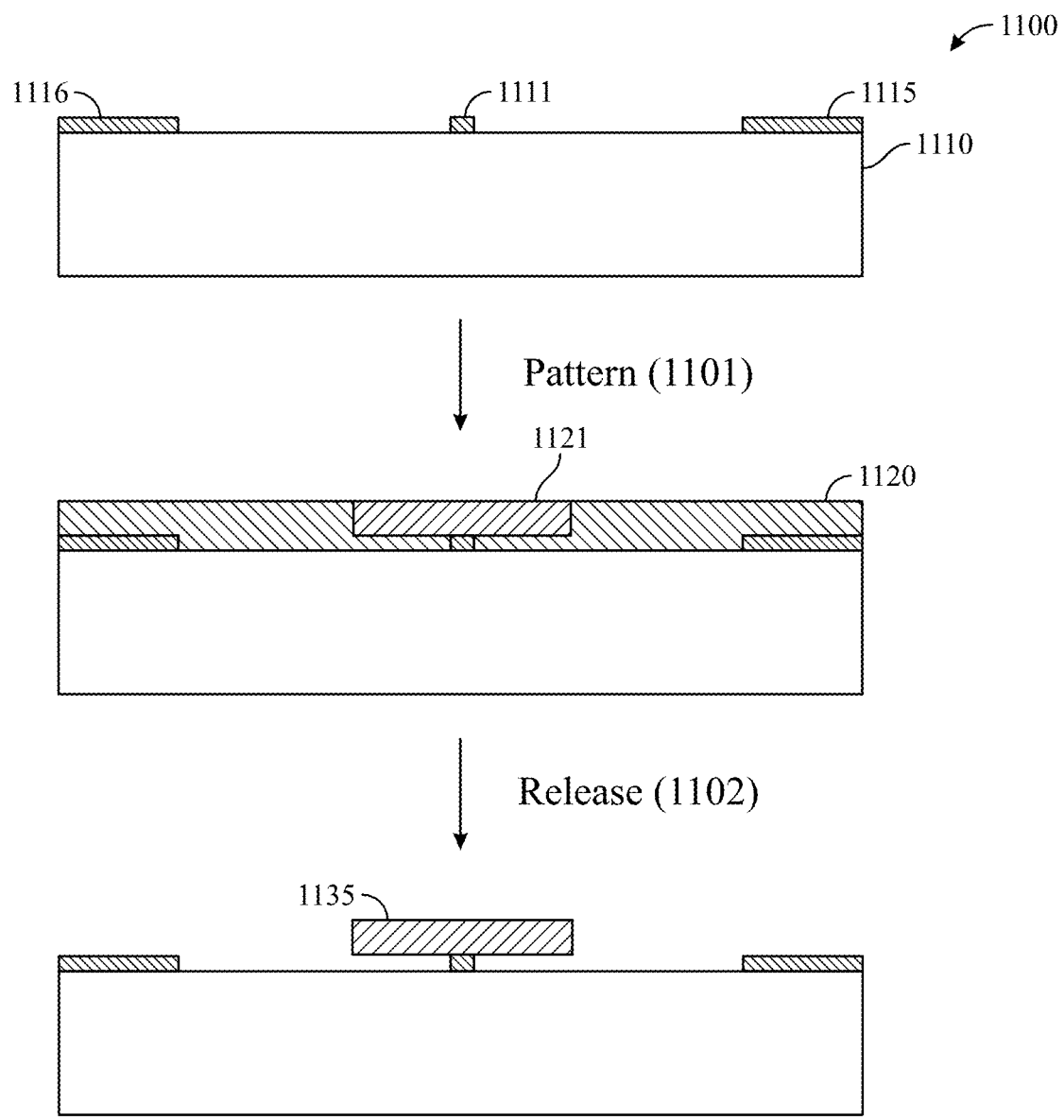
FIG. 8 shows a schematic of another exemplary method 1100 to form a microfabricated magnetic resonator disposed on a non-etched substrate 1110.
Figure 9:
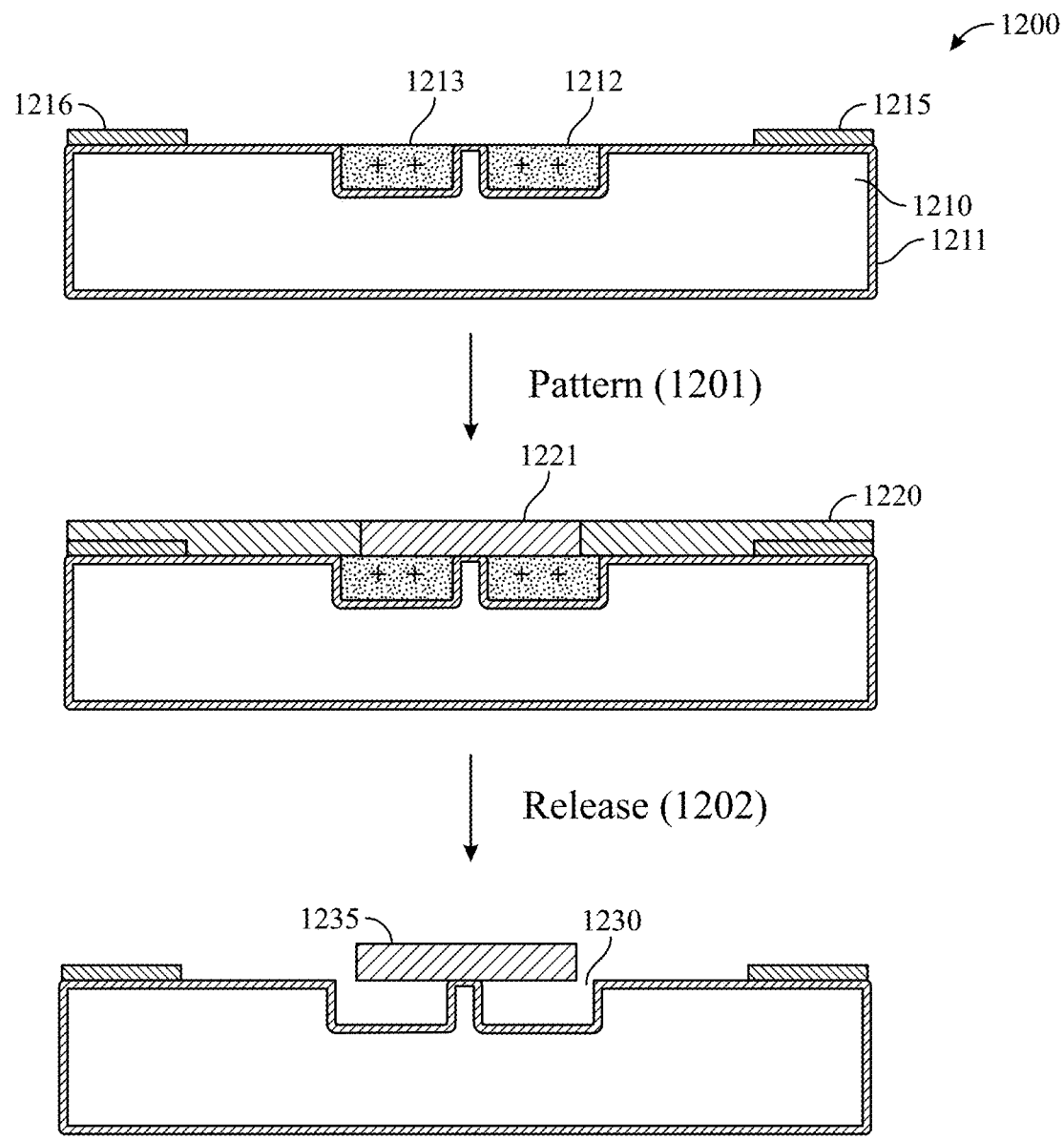
FIG. 9 shows a schematic of yet another exemplary method 1200 to form a microfabricated magnetic resonator disposed on a substrate 1210 having an oxidized layer 1211.

Further exemplary non-limiting processes are provided in FIGS. 7-9. As seen in FIG. 7, one exemplary process 1000 includes forming the resonator portion(s) on a substrate, and then etching the substrate around the resonator portion(s). First, a surface of a substrate 1010 having one or more electrical contacts 1015, 1016 is provided. If the substrate is composed of a photoetchable material, then one or more opening patterns 1011 can be photopatterned into the substrate 1010. For instance, this step can be conducted by spinning a layer of photoresist and patterning the electrical contacts, depositing (e.g., by way of electron beam evaporation) one or more conductive materials, and removing the photoresist layer, thereby forming the electrical contact(s). Then, the opening can be patterned by spinning a layer of photoresist on a surface of the substrate and developing the photoresist to from a mask having the opening pattern, and the opening can be formed by exposing the photoetchable material of the substrate and etching away the exposed regions.

Then, the resonator portion is patterned 1001. In one instance, an optional seed layer is deposited, and a layer of photoresist 1020 is deposited on the seed metal. Next, the photoresist is patterned (e.g., by any useful method, such as those provided herein) to include a micropattern configured to receive one or more components of the magnetostrictive material (e.g., a cobalt source, an iron source, and any optional additive). One or more such components 1021 are electrodeposited in the micropattern to form the resonator portions (e.g., by placing the substrate in a plate solution containing such components).

Finally, the resonator portion 1035 is released 1002 by removing any remaining material (e.g., photoresist, seed layers, etc.) and etching the substrate to provide an opening 1030. Optionally, the structure can include a post 1036 that supports the resonator portion. The substrate can be composed of any useful material, such as a photosensitive glass ceramic material (e.g., Apex® glass). Upon exposure to a light source (e.g., an ultraviolet light source) and subsequent baking, the exposed and baked photosensitive material is converted into a ceramic material. This ceramic material is more easily etched, as compared to the non-exposed material that is more akin to glass. In this way, photolithography can be employed to provide an opening pattern, and subsequent etching then provides the opening.

As seen in FIG. 8, another exemplary process 1100 includes patterning a post and forming the resonator portion (s) on the post. First, a surface of a substrate 1110 having one or more electrical contacts 1115,1116 is provided. A post 1111 is disposed on this substrate 1110, which can be patterned and deposited in any useful manner.

Then, the resonator portion is patterned 1101. In one instance, an optional seed layer is deposited, and a layer of photoresist 1120 is deposited on the seed metal. Next, the photoresist is patterned (e.g., by any useful method, such as those provided herein) to include a micropattern configured to receive one or more components of the magnetostrictive material (e.g., a cobalt source, an iron source, and any optional additive). One or more such components 1121 are electrodeposited in the micropattern to form the resonator portions (e.g., by placing the substrate in a plate solution containing such components). Finally, the resonator portion 1135 is released 1102 by removing any remaining material (e.g., photoresist, seed layers, etc.).

As seen in FIG. 9, yet another exemplary process 1200 includes patterning a post and forming the resonator portion(s) on the post. The substrate 1210 can include an oxidized layer 1211 (e.g., a conformal oxidized layer). First, an oxidized surface 1211 of a substrate 1210 having one or more electrical contacts 1215, 1216 is provided. A post 1213 is disposed on this substrate 1210, and the opening surrounding the post 1213 can be filled with a sacrificial material 1212 (e.g., a dielectric, a polysilicon, etc.).

Then, the resonator portion is patterned 1201. In one instance, an optional seed layer is deposited, and a layer of photoresist 1220 is deposited on the seed metal. Next, the photoresist is patterned (e.g., by any useful method, such as those provided herein) to include a micropattern configured to receive one or more components of the magnetostrictive material (e.g., a cobalt source, an iron source, and any optional additive). One or more such components 1221 are electrodeposited in the micropattern to form the resonator portions (e.g., by placing the substrate in a plate solution containing such components). Finally, the resonator portion 1235 is released 1202 by removing any remaining material (e.g., photoresist, seed layers, etc.) and forming an opening 1230.

Signal Detection Systems and Telemetry Units

The resonator can be configured in any useful signal detection system, including those provided in telemetry units. The resonators herein including a magnetoelastic material respond to externally applied magnetic fields. Exposure of the resonators to a time-varying, externally applied magnetic interrogation signal (e.g., an AC magnetic interrogation signal) results in Joule magnetostriction, $\lambda = \Delta L/L$ (i.e., a physical deformation characterized by change in length $\Delta L$, where $\lambda_{sat.}$ is the value A at saturation). In addition, this exposure generates longitudinal vibrations, which in turn produces elastic waves that emit a magnetic response signal (e.g., an AC magnetic response signal). The emitted response signal can be detected in any useful way, e.g., by magnetic, acoustic, and/or optical systems. Conversely, exposure to an external mechanical stress or strain results in a change in magnetostriction, termed the Villari effect. Thus, a pristine surface and a structurally flawed surface exhibit different magnetostriction, A, when exposed to an applied magnetic field.

Signal detection systems, including telemetry units, can include any useful components to provide and/or detect signals (e.g., interrogation signals and/or response signals). Exemplary components include an excitation circuit configured to provide one or more interrogation signals (e.g., including one or more of a frequency domain sine wave generator, a time domain pulse generator, an AC excitation circuit (e.g., including an input from a direct digital synthesis component, a potentiometer, and/or one or more amplifiers), and/or a DC excitation circuit. Example DC excitation circuits include a voltage source, a potentiometer, an inductor, and/or one or more amplifiers.

Further components can include an excitation coil to provide a magnetic interrogation signal, such as one or more of Helmholtz coils, pick-up coils, solenoid coils, AC coils, and/or DC coils, which can optionally also serve as the sensing coil.

Further components can include a bias coil to provide a rotating bias field; an example bias coil would consist of one or more Helmholtz coils. One or more electronic switches may be included for use, e.g., in combination with a single coil capable of both providing an interrogation signal and receiving a response signal, so that the electronic switch alternately isolates the excitation and receiving circuits.

Further components can include a permanent biasing magnet to achieve the optimal $\lambda_{sat.}$ operating point; a power supply to provide current to one or more coils; and a multimeter. A laser or LED is optionally included for detecting magnetostriction of the resonator by optical reflection off of a specularly reflecting surface of the resonator. A detector for detecting one or more response signals can include, e.g., a microphone to detect an acoustic response signal, a sensing coil to detect a magnetic response signal, or a phototransistor to detect an optical response signal. A sensing coil can be, without limitation, any coil described herein optionally in combination with a multiplexer. A phototransistor is optionally used in combination with one or more mirrors, beam splitters, coarse sensors, fine sensors, piezoelectric translators, locked-in amplifiers, oscillators, and/or phase shifters.

Still further components can include a receiving circuit configured to process one or more response signals. The receiving circuit can include a microcontroller for controlling any of the various components described herein, such as one or more excitation circuits and one or more detectors. The receiving circuit can include a multichannel analog-to-digital converter (ADC), a frequency domain lock in amplifier, a time domain digital oscilloscope, a network impedance analyzer, a phase detection circuit (e.g., including a comparator, an XOR gate, an ADC, and/or a filter), and/or an amplitude detection circuit, which itself may include an amplifier, an RMS-DC converter, and/or an ADC.

Interrogation and response signals can be provided and detected in any useful format. In some embodiments, the signal detection system relies on a time-domain measurement technique, in which the interrogation signal is a sinusoidal magnetic field impulse (e.g., using an excitation coil) and the response signal is a time-domain response that can be analyzed in any useful way.

In an example, the receiving circuit is configured to determine the resonance frequency by converting the response to a frequency spectrum and then identifying the peak in that spectrum (e.g., with a Fast Fourier Transform algorithm or with statistical fitting by a Poisson process) or by counting the number of oscillations for a given period (e.g., with frequency counting).

In other examples, the signal detection system relies on a frequency-domain measurement technique, in which the interrogation signal is a fixed-frequency, steady state signal, and the response signal is detected by sweeping a frequency range and by determining the frequency that provides the maximum amplitude signal.

In another example, the signal detection system relies on an impedance de-tuning method, in which the resonator tag interacts with an inductive solenoid, and the response signal is the change in impedance of the solenoid measured as a function of frequency using, e.g., a network impedance analyzer.

MEMS Based Devices

In one embodiment, the device is a tunable microfabricated (e.g., MEMS) device. In one instance, the device includes a substrate; a stationary anchor disposed on the substrate; a stationary electrode disposed on the substrate; an actuation electrode (e.g., a stationary actuation electrode) disposed on the substrate and located between the stationary anchor and the stationary electrode; and a cantilever including an extended arm having a first end and a second end, in which the first end is affixed to the stationary anchor, the second end is suspended over the stationary electrode, and a center portion of the extended arm is suspended over the actuation electrode; and in which a top surface of the cantilever includes a layer of an electrodeposited material comprising cobalt and iron. Exemplary devices are provided in FIGS. 10-12.

Figure 10:
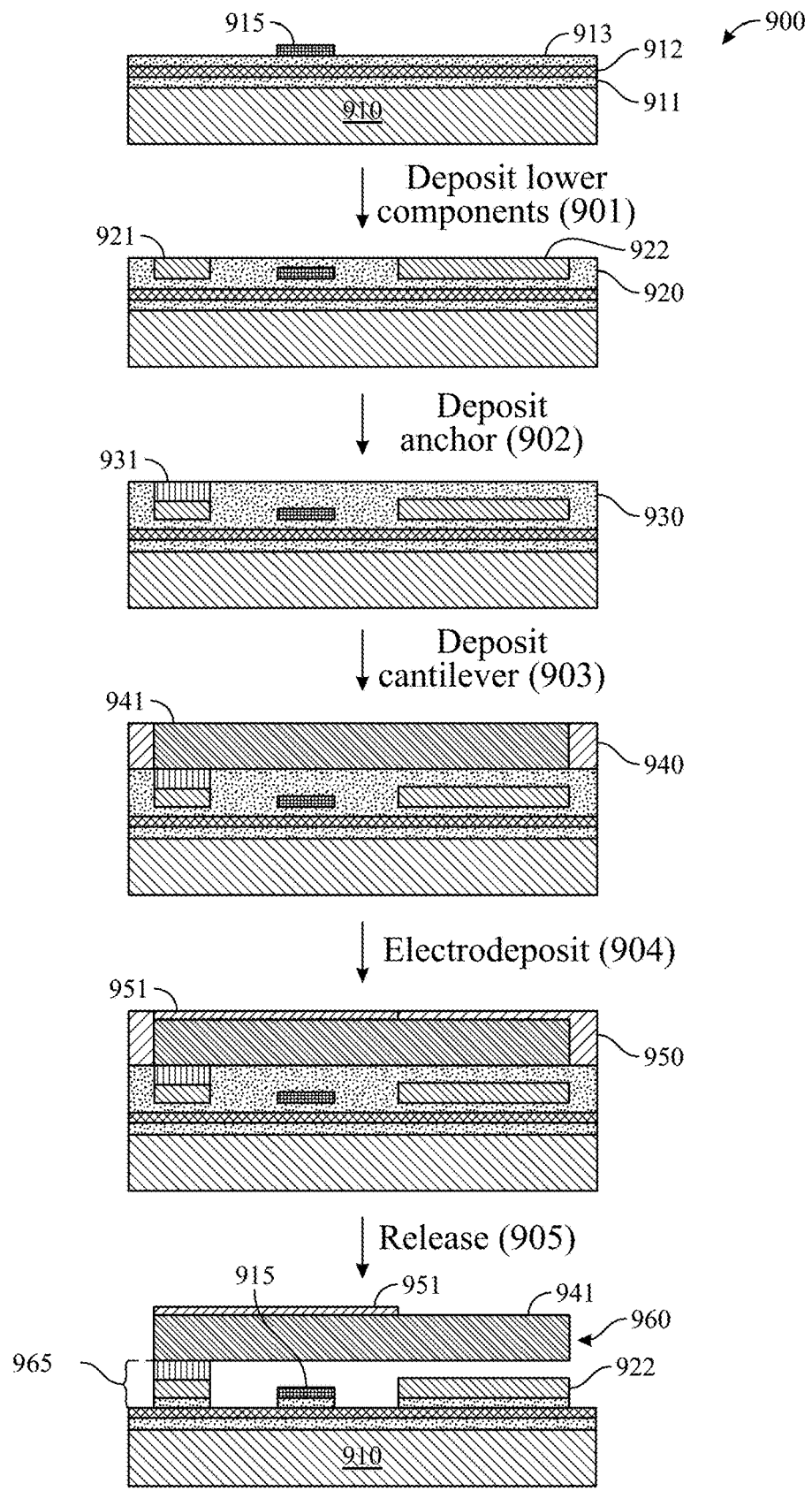
FIGS. 10-13 show exemplary tunable microfabricated capacitors including an electrodeposited material. Provided are (FIG. 10) an exemplary method 900 for forming a capacitor 960, as well as schematics of (FIG. 11) an exemplary tunable capacitor 9000 having a cantilever 9041 and a stationary electrode 9022 forming a capacitive element, (FIG. 12) another exemplary tunable capacitor 9100 having a movable electrode 9125 and a stationary electrode 9122 forming a capacitive element, and (FIG. 13) yet another exemplary tunable capacitor 9200 having a movable actuation electrode 9216 and a stationary actuation electrode 9215.

The device can be manufactured in any useful manner. FIG. 10 shows an exemplary method 900 for fabricating a tunable device including an electrodeposited layer (e.g., composed of a material having magnetostrictive properties, such as any cobalt- and iron-containing material or alloy described herein). The method 900 includes providing a stack including a substrate 910 and one or more dielectric layers 911, 912, 913. Any useful dielectric layers can be included. On a top surface of one dielectric layer, a stationary actuation electrode 915 can be patterned.

The stack can be fabricated in any useful manner. In one instance, the stack is formed by depositing a first dielectric layer 911 (e.g., a silicon dioxide layer) on a top surface of a substrate 910 (e.g., a silicon substrate). Then, a second dielectric layer 912 (e.g., a silicon nitride layer) and a final dielectric layer 913 (e.g., a silicon dioxide layer, and which can optionally serve as a sacrificial layer) are deposited. In another instance, the stack includes one or two dielectric layers.

A stationary actuation electrode can be formed in any useful manner. In one instance, a layer of photoresist is deposited on the stack, and then a mask having a desired pattern for the stationary actuation electrode is aligned on the photoresist layer and then exposed to form the pattern. One or more deposition steps (e.g., by way of electron beam evaporation) can be applied to form the stationary actuation electrode 915. The photoresist layer can then be removed, and, optionally, one or more deposition steps can be conducted to provide a seed layer.

Next, further lower metal components are deposited 901, including an anchor portion 921 and a stationary electrode 922 surrounded by a further dielectric layer 920. In one instance, this deposition step 901 can include depositing a dielectric to form a further dielectric layer 920 (e.g., a silicon dioxide layer deposited by way of vapor deposition), spinning a photoresist layer on the dielectric layer, as well as micropatterning of regions that define the anchor portion and the stationary electrode in the photoresist layer. The dielectric layer can be etched (e.g., down to the seed layer) to open up the areas for the anchor portion and the stationary electrode. Then, electroplating of a material (e.g., one or more conductive materials) within that opened area provides the formed anchor portion 921 and the stationary electrode 922. Optionally, one or more polishing steps can be conducted to planarize the electroplated components to the dielectric surface. For instance, FIG. 10 provides a stack having electroplated components 921, 922 that are planarized to the surface of the dielectric layer 920.

Then, a further pedestal portion 931 is deposited 902. In particular embodiments, the anchor portion and the pedestal portion, together, form the anchor for the cantilever. In one instance, this deposition step 902 can include depositing a dielectric to form another dielectric layer 930, spinning a photoresist layer on the dielectric layer, as well as micropatterning and exposing of the region or pattern for the pedestal portion in the photoresist layer. One or more deposition steps (e.g., by way of electron beam evaporation) can be applied to form the pedestal portion 931. The photoresist layer can then be removed (e.g., by way of one or more polishing steps to planarize the deposited components to the dielectric surface), and, optionally, one or more deposition steps can be conducted to provide a seed layer.

The cantilever can be patterned and disposed on a stationary anchor (e.g., including an anchor portion and the pedestal portion). In one instance, the method includes depositing 903 a cantilever 941 that is connected to the stationary anchor. In one instance, this deposition step 903 can include spinning a photoresist layer on the stack, as well as micropatterning and exposing of the cantilever pattern in a photoresist layer. One or more deposition steps (e.g., by way of electron beam evaporation) can be applied to form the cantilever 941. The photoresist layer can then be removed (e.g., by way of one or more polishing steps to planarize the electroplated components to the dielectric surface).

The electrodeposited material including cobalt and iron can be provided in any useful manner. In one instance, the electrodeposited material is provided on a top surface of the cantilever, thereby providing an actuation element that is connected to the movable cantilever. In one instance, the method includes spinning a photoresist layer 950, exposing a region of a top surface of the cantilever, and then electrodepositing 904 the electrodeposited material 951 in the region on that top surface of the cantilever. The electrodeposited material can be provided along the entire length of the cantilever or along a portion of the length of the cantilever. Furthermore, the electrodeposited material can be provided on any surface (e.g., a top surface of the cantilever or a portion of this top surface).

Finally, one or more photoresist layers and/or dielectric layers can be etched to release 905 the tunable device 960. The device 960 can include any useful arrangement of components, including a substrate 910, a stationary anchor 965 disposed on the substrate 910 and optionally including a portion of a dielectric layer, and a cantilever 941. The cantilever 941 can include an extended arm having a first end that is affixed to the stationary anchor 965. The second end of the cantilever can be configured to move in any useful direction.

The device can include any useful further components, including stationary components (e.g., disposed on the substrate) and movable component (e.g., disposed on the cantilever). For instance, the device can include a stationary actuation electrode 915 disposed on the substrate 910 and optionally including a portion of a dielectric layer, as well as a stationary electrode 922 disposed on the substrate 910 and optionally including a portion of a dielectric layer. The stationary actuation electrode 915 can be located between the stationary anchor 965 and the first stationary electrode 922.

Figure 11:
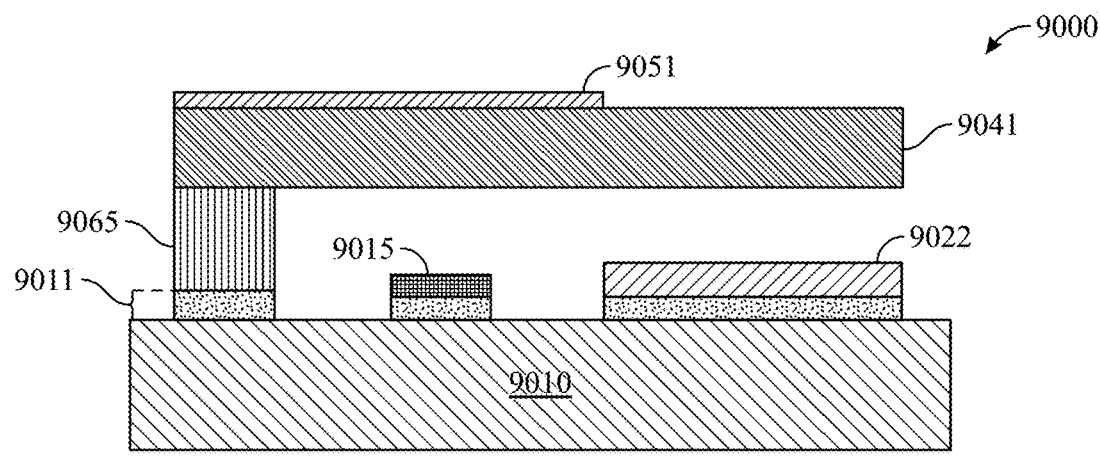
Figure 12:
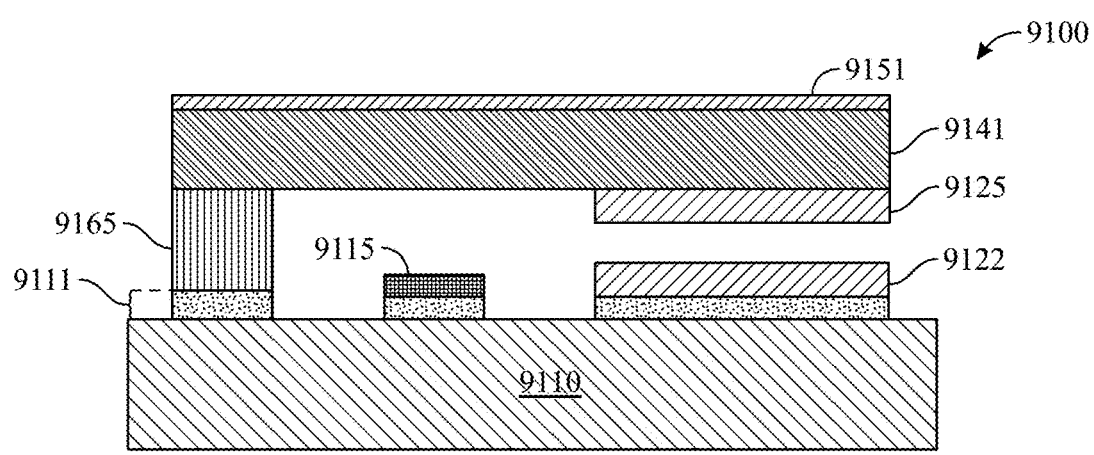
Figure 13:
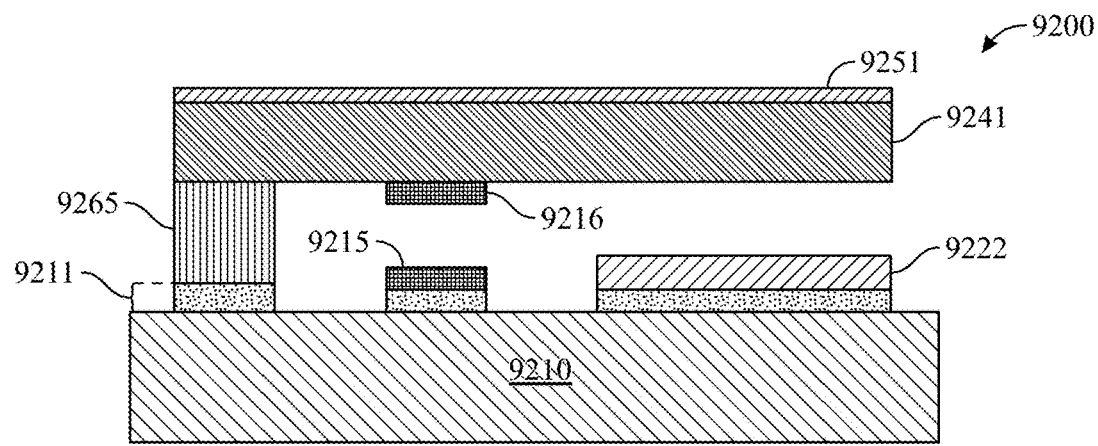

Other structures for tunable devices are provided in FIGS. 11-13. In FIG. 11, the device 9000 includes a stationary anchor 9065 disposed on a substrate 9010 and optionally including a dielectric layer 9011, as well as a cantilever 9041 having a first end affixed to the anchor 9065. The cantilever 9041 also supports a layer of an electrodeposited material 9051 having a magnetostrictive property. Additional electrodes include a stationary actuation electrode 9015 and a stationary electrode 9022, each of which is disposed on the substrate 9010. The stationary actuation electrode 9015 can be located in any useful location, such as between the stationary anchor 9065 and the first stationary electrode 9022. The anchor, including anchor portions and pedestal portions, can be formed of any useful material, e.g., a conductive material (e.g., any herein), a dielectric (e.g., any herein), as well as layers, laminates, or multilayers thereof.

In FIG. 12, the device 9100 includes a stationary anchor 9165 disposed on a substrate 9110 and optionally including a dielectric layer 9111, as well as a cantilever 9141 having a first end affixed to the anchor 9165. The cantilever 9141 also supports a layer of an electrodeposited material 9151 having a magnetostrictive property. Additional electrodes include a stationary actuation electrode 9115, a stationary electrode 9122, and a movable electrode 9125. Each of these electrodes is disposed on the substrate 9010 or on the cantilever 9141. The movable electrode 9125 and the stationary electrode 9122 can be aligned (e.g., along a major plane of a conductive plate electrode for each of the movable and stationary electrodes) to provide a capacitive signal.

In FIG. 13, the device 9200 includes a stationary anchor 9265 disposed on a substrate 9210 and optionally including a dielectric layer 9211, as well as a cantilever 9241 having a first end affixed to the anchor 9265. The cantilever 9241 also supports a layer of an electrodeposited material 9251 having a magnetostrictive property. Additional electrodes include a stationary actuation electrode 9215, a movable actuation electrode 9216, and a stationary electrode 9222. Each of these electrodes is disposed on the substrate 9210 or on the cantilever 9241. The stationary actuation electrode 9215 and the movable actuation electrode 9216 can be aligned to maximize an electric field between these electrodes.

In some embodiments, the cantilever includes a conductive material (e.g., an ohmic material, a metal, etc.), thereby forming a capacitive element between a portion of the second end of the cantilever and the stationary electrode. For instance, for the device 960 in FIG. 10, the cantilever 941 can be composed of a conductive metal, which is positioned across from a stationary electrode 922 and separated by a gap. Exemplary, non-limiting conductive materials include a metal (e.g., silver, gold, aluminum, nickel, chromium, titanium, copper, as well as alloys and multilayers thereof).

In other embodiments, the cantilever includes a first movable electrode located in proximity to the second end of the cantilever, thereby forming a capacitive element between the first movable electrode and the stationary electrode. For instance, for the device 9100 in FIG. 12, the cantilever 9141 can include a first movable electrode 9125, which is positioned across from a stationary electrode 9122 and separated by a gap.

In yet other embodiments, the cantilever includes any other useful electrical element. For instance, for the device 9200 in FIG. 13, the cantilever 9241 can include a movable actuation electrode 9216, which is positioned across from a stationary actuation electrode 9215.

The cantilever can be configured to move in any useful direction (e.g., a horizontal direction or a vertical direction). Furthermore, the electrodeposited material (e.g., including cobalt and iron) can be any described herein. Finally, one or more dielectric layers can be present to electrically isolate any element (e.g., conductive elements, including one or more electrode(s) and the cantilever). Exemplary, non-limiting dielectric materials include a silicon oxide (e.g., $SiO_2$), silicon nitride (e.g., $Si_3N_4$), air, hafnium oxide, zirconium oxide, aluminum oxide, or a polymer.

The present invention also includes methods of operating a tunable device. In one example, the device is exposed to a magnetic field, thereby altering a material strain of the electrodeposited material. In further embodiments, the alteration in material strain further alters the capacitance value, thereby providing a tunable capacitive element.

In some embodiments, the tunable device includes a tunable capacitor, a tunable filter, an oscillator, or a tunable switch.

EXAMPLES

Example 1: Magnetoelastic Smart Sensors

Figure 14:
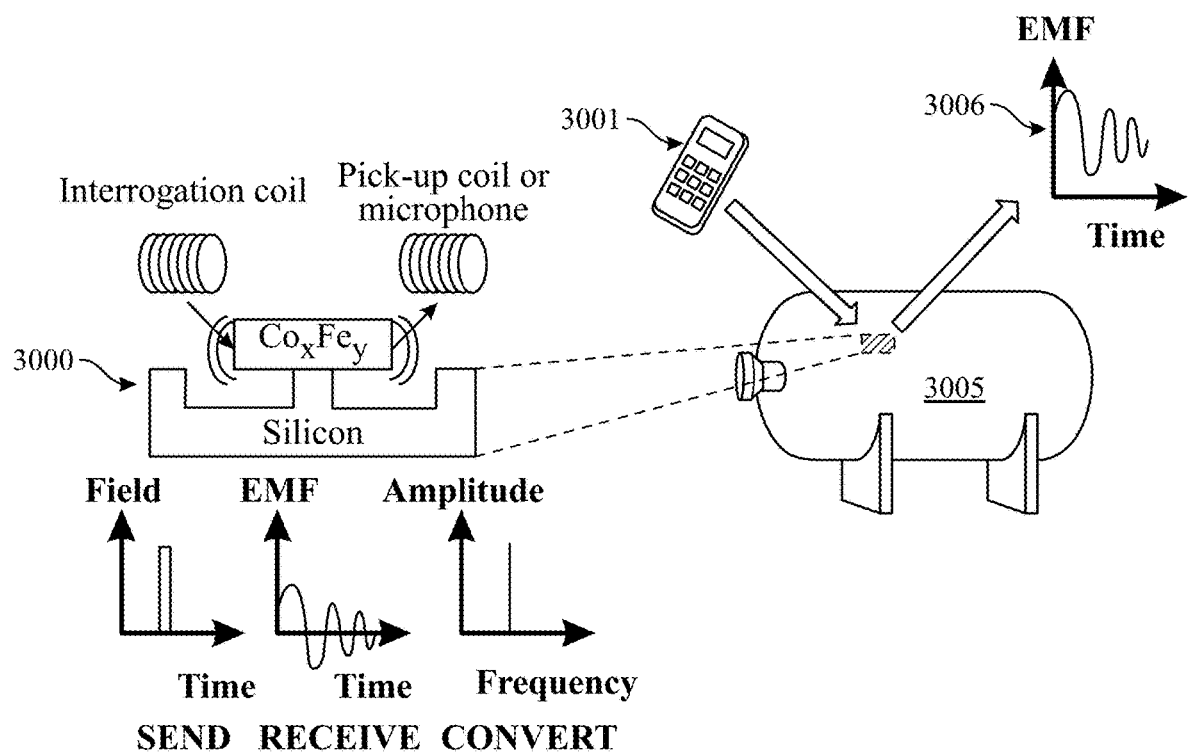
FIG. 14 shows a schematic of an exemplary resonator in use and an exemplary signal detection system. Left: A wireless, zero power $Co_xFe_y$ sensor 3000 supported by a silicon post serves as the resonator tag. An interrogation coil sends a magnetic pulse to the tag or sensor, and a pick-up coil (or microphone) receives the emitted signal from the mechanical ring down. Right: In use, a pressure vessel 3005 with a $Co_xFe_y$ sensor 3000 is interrogated with a hand held unit 3001, thereby emitting a response signal 3006.

As shown in FIG. 14, a near field, AC magnetic field signal is applied via a loop antenna coil to thin rectangular strips of magnetostrictive sensor 3000. This field signal can induce longitudinal mode vibrations in the magnetostrictive material that, in turn, emit their own oscillating magnetic field generated from the resonator mechanical ring down. The field signal can be transmitted by a hand held unit 3001 to the pressure vessel 3005 having the sensor 3000.

The emitted signal 3006 can be wirelessly detected by another pickup coil, a microphone, or by the same coil switched from a transmitting to a receiving circuit. Due to their magnetomechanical nature, on board power isn't needed, allowing these devices to be operated without batteries and enabling long lifetimes. Small changes in resonator geometry and magnetic biasing field allow for architectures capable of detecting many environmental parameters, such as temperature, pressure, and caustic environments.

Example 2: Electrodeposition Process for CoFe Magnetostrictive Resonators

We have developed a stable chemistry and process to electrodeposit an alloy film of cobalt and iron ($Co_xFe_y$) for use as a smart tag and sensor. Various strategies were employed to develop the chemistry (e.g., chemical reagents and composition of the plating bath) and deposition process (e.g., plating condition) that provided a film with a 70-80 atomic % (at. %) cobalt stoichiometry, which was optimal for magnetostrictive properties. Furthermore, these strategies minimized the inclusion of oxygen, controlled the phase of the alloy to improve the magnetostrictive properties, and increased the signal amplitude for magnetic resonance response.

Regarding the chemistry development, we chose particular chemical reagents and additives to control film properties. First, we selected cation sources and concentrations to achieve the desired stoichiometries and speciation. Second, we included oxygen scavengers to prevent the oxidation of iron and the incorporation of ferric hydroxide and oxygen into the films. Third, we implemented grain refiners and surfactants in order to control film properties.

Regarding the deposition process, we optimized plating parameters to achieve the desired stoichiometry and phase that are favorable for high magnetostrictive films. In particular, these parameters include chemistry composition (e.g., chemical reagents with one or more additives), pH (e.g., less than about 4, such as about 2), temperature (e.g., more than about 25° C., such as about 50° C.), current density (e.g., more than about 30 $mA/cm^2$, such as about 40 $mA/cm^2$), pulsing time durations (e.g., such as a duty cycle having an "on" and "off" phase that is each more than 1 second), agitation (e.g., of from about 100 to 500 rpm), and use of constant gas flow (e.g., constant bubbling of an inert gas, such as $N_2$). Additional details follow.

Chemical Reagents:

An iron tetrafluoroborate and cobalt sulfamate chemistry was chosen due to their stability and high stoichiometric ratio of cobalt. Various conditions were tested to study the diffusion and kinetics of CoFe deposition. These conditions included (i) iron tetrafluoroborate.$6H_2O$ (0.11 M), cobalt sulfamate (0.29 M), sodium citrate (0.5 M), and boric acid (0.5 M) (Co—Fe condition); (ii) iron tetrafluoroborate.$6H_2O$ (0.11 M), sodium citrate (0.5 M), and boric acid (0.5 M) (Fe only condition); (iii) cobalt sulfamate (0.29 M), sodium citrate (0.5 M), and boric acid (0.5 M) (Co only condition); and (iv) sodium citrate (0.5 M) and boric acid (0.5 M) (supporting electrolyte condition). All reagents were purged with $N_2$ before use for 30 minutes and maintained under $N_2$ while in use to minimize oxygen absorption that can be deposited into the alloy.

In one set of experiments, agitation improved the appearance of the films and had a higher Co concentration at lower current densities. Based on hull cell testing, a pulsing regime using a current density of about 40 $mA/cm^2$ provided an appropriate at. % of Co of more than about 60 at. %. Based on these results, a current density of >40 $mA/cm^2$ was further evaluated to increase atomic % of cobalt to about 70 at. %, thereby providing a film with improved magnetostriction.

Stress analysis tests were also conducted. Samples were plated on Cu "tuning" forks designed for stress testing to evaluate the compressive or tensile stress in deposited films. In some of the films, the highest stress was measured at 30 mA/cm$^2$. Based on these stress measurement, as there is only a 1 cm separation on the fork tines at highest stress, this separation should not interfere with magnetic measurements.

Additives: Additives were included to obtain a metallic film. For instance, while stoichiometry was controlled using the reagents and deposition parameters herein, the obtained films were not metallic. Thus, although the desired stoichiometry was obtained (e.g., 70 at. % of Co), the films were highly oxidized and powdery. To improve magnetostriction, the oxidation of Fe$^{2+}$ and the inclusion of oxygen were inhibited. In particular, two types of oxygen scavengers were employed to decrease or minimize Fe oxidation: ascorbic acid and trimethylamine borane (TMAB).

Figure 15:
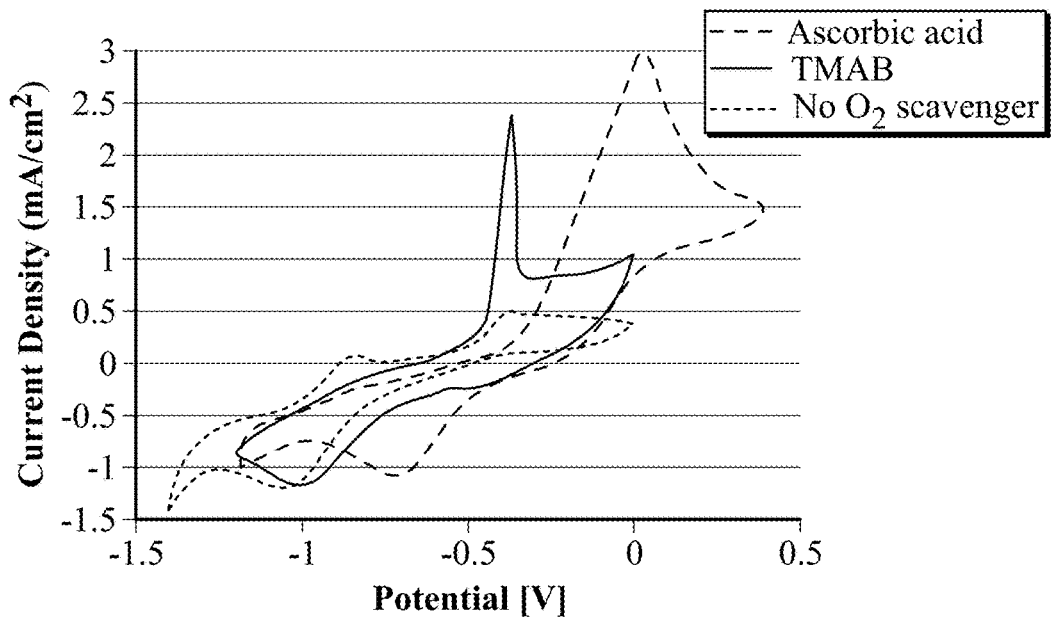
FIG. 15 shows cyclic voltammetry (CV) data for $Co_xFe_y$ films with or without oxygen ($O_2$) scavengers for CV scans at 10 mV/sec.

As shown in FIG. 15, films with either TMAB or ascorbic acid displayed less Fe oxidation, as compared to a control film lacking an oxygen scavenger. In particular, TMAB provided an optimal film with a sharp oxidation peak that is more cathodic than the ascorbic acid. In some embodiments, two or more oxygen scavengers (e.g., TMAB and ascorbic acid) can be employed in the plating solution.

Other additives were considered, such as a grain refiner and a surfactant. For instance, a grain refiner can be employed to control the morphology or grain size in the film (e.g., by reducing stress during deposition). In yet another instance, a surfactant can be employed to control pitting in the film.

Optimized conditions: The following are two different chemical conditions (i.e., Condition A and B), which are provided as non-limiting examples. Normally, iron-based chemistries have very short shelf lives (e.g., from hours to days) before the formation of precipitates, which diminishes bath performance. Both Conditions A and B encompass highly stable chemistries with shelf lives of over 2 months. These conditions are described below.

For Condition A, the following chemical process was employed. The plating bath was initially composed of deionized water maintained at a temperature of about 50° C. under stir bar agitation at about 250 rpm. Throughout the deposition process, an N$_2$ bubbler was inserted and maintained in the bath. The following agents were added in the following order: 0.5 M boric acid (an electrolyte); 0.05 M ascorbic acid (an oxygen scavenger); 0.05-0.1 M saccharin sodium salt (a grain refiner); 0.1 M trimethylamine borane (TMAB) (an oxygen scavenger); 0.4 M cobaltous sulfamate (a cobalt source); 0.01 M sorbitol; and about 10 drops of APY-17 (a surfactant) per 400 ml volume. Next, the pH was adjusted to about 2.0 using fluoroboric acid. Finally, 0.08 M iron tetrafluoroborate (an iron source) was added.

For Condition B, the chemical process was similar to that of Condition A, except for the following changes. First, the pH was adjusted to about 2.0 using a 5 vol. % H$_2$SO$_4$ solution. Second, a different iron source, i.e., 0.08 M ammonium ferrous sulfate, was added to the bath.

Both Conditions A and B were stable (e.g., having a shelf life of over 2 months) and provided metallic films. In addition, both conditions provided films having low oxygen content (e.g., less than about 8 at. % oxygen after EDS analysis). Using the conditions as described herein, the films obtained from Condition B (employing ammonium ferrous sulfate) provided films having higher magnetostrictive behavior, as compared to films obtained from Condition A (employing ferrous tetrafluoroborate as the iron source). Without wishing to be limited by mechanism, the change in the iron source likely changes the phase structure present in the final film, which in turn impacts magnetic properties. A skilled artisan would understand how the conditions described herein (e.g., Conditions A and B) can be modified to obtain films with the appropriate morphology, magnetostrictive behavior, and surface properties.

For both Conditions A and B, the following deposition process was employed. All reagents were sparged using a N$_2$ bubbler for 30 minutes prior to use. In addition, the chemical reagents and bath were maintained under a bed of N$_2$ using the bubbler inserted in the top layer of the plating bath during deposition. During plating, temperature was maintained at about 50° C., and agitation was maintained at about 250 rpm. Plating was performed using a galvanostatic pulse. The "on" portion of the cycle was a cathodic 40 mA/cm$^2$ sweep applied for 2-3 seconds, and the "off" portion was a 0 mA/cm$^2$ current density applied for 3 seconds.

The duration of the "on" and "off" cycles affected the film stoichiometry. For instance, by varying the "on" time between 2-3 seconds, we tailored the stoichiometric ratio of cobalt in the films. The longer the pulse time, the greater percentage of cobalt because deposition of iron is mass transfer limited. In some embodiments, the cobalt percentage can be from about 70 at. % to 80 at. %, and this range demonstrated high magnetostrictive properties in our testing. With a set "off" time of about 3 seconds, the oxygen scavengers can reduce any formed Fe(OH)$_3$ in the bath, and the concentrations at the interface can be restored to bulk concentrations.

The number of cycles can be used to control the film thickness. At 220 cycles, the film thickness was approximately 10 μm, and this thickness can be scaled accordingly with a current efficiency of approximately 98%.

Various plating parameters may be further optimized. For instance, the deposition current and pulsing regime could be altered to adjust the deposition kinetics for a chosen molar ratio of the iron and cobalt sources. In addition, the plating temperature can include a range in which the chosen chemistry can operate. Generally, the composition will change as the temperature changes. For the conditions herein, the composition was approximately constant within a range of 45° C. to 55° C. The order of adding the reagents should ensure proper speciation (or complexation), while avoiding precipitate formation. Finally, pH will also affect chemistry, deposition kinetics, and effective concentration of the proper species. Thus, pH should be chosen to provide the appropriate resulting phase, stoichiometry, and stress of the deposit. A skilled artisan would understand how these parameters could be optimized, tested, and employed to form a desired film.

Accordingly, the chemistry and deposition process described herein can be combined with one or more micropatterning methods to provide a micropatterned resonator having enhanced magnetostriction and multi-frequency signals.

Example 3: Magnetic Characterization of CoFe Magnetostrictive Films

The Co$_x$Fe$_y$ films were prepared, as described in Example 2, and characterized, as described below. Films were either deposited with pulsed current ("Pulsed") or direct current ("DC"). Reagents included iron tetrafluoroborate ("IT") or ammonium ferrous sulfate ("AFS") as the iron source, as described above in Example 2. Magnetization curves were obtained via SQUID for various samples (Table 1).

TABLE 1

Magnetization curves

| No. | Sample | $M_{sat.}$ (A/m × $10^6$) | Coercivity (A/m) |
|---|---|---|---|
| Control | Metglas ® 2605SA1 | 1.07 | 813 |
| 1 | $Co_{67}Fe_{33}$ (DC, IT) | 0.193 | 13930 |
| 2 | $Co_{68.2}Fe_{31.8}$ (DC, IT) | 0.152 | 12210 |
| 3 | $Co_{80.8}Fe_{19.2}$ (Pulsed, IT) | 0.893 | 2893 |
| 4 | $Co_{64.9}Fe_{35.1}$ (Pulsed, AFS) | 2.05 | 468 |
| 5 | $Co_{77}Fe_{23}$ (DC, AFS) | 2.00 | 2377 |
| 6 | $Co_{80.6}Fe_{19.4}$ (Pulsed, AFS) | 1.61 | 2884 |

* For the $Co_xFe_y$ films, stoichiometric ratios x:y are provided as subscripts.

As seen in Table 1, electroplated samples employing ammonium ferrous sulfate (AFS) possessed higher magnetization values $M_{sat.}$. In particular, samples 4-6 possessed enhanced magnetization properties as compared to commercially available material, Metglas® 2650SA1 (a magnetic alloy including 1-5 wt. % boron, 85-95 wt. % iron, and 5-10 wt. % silicon).

Samples were also tested by measuring displacement of the film upon being exposed to a 0.124 T magnetic field from a solenoid. Metglas® samples, with a known magnetostriction of $\lambda$=27 ppm, were used as a baseline for magnetic field testing. Solenoid testing of Metglas® provided a displacement of 0.390±0.051 cm. Magnetostrictive materials can be characterized by a magnetostriction constant A, which is the strain measured in the direction of the magnetization field as the material passes from the demagnetized state to the saturation. A greater A value indicates a greater change in dimension when exposed to a magnetic field.

Figure 16:
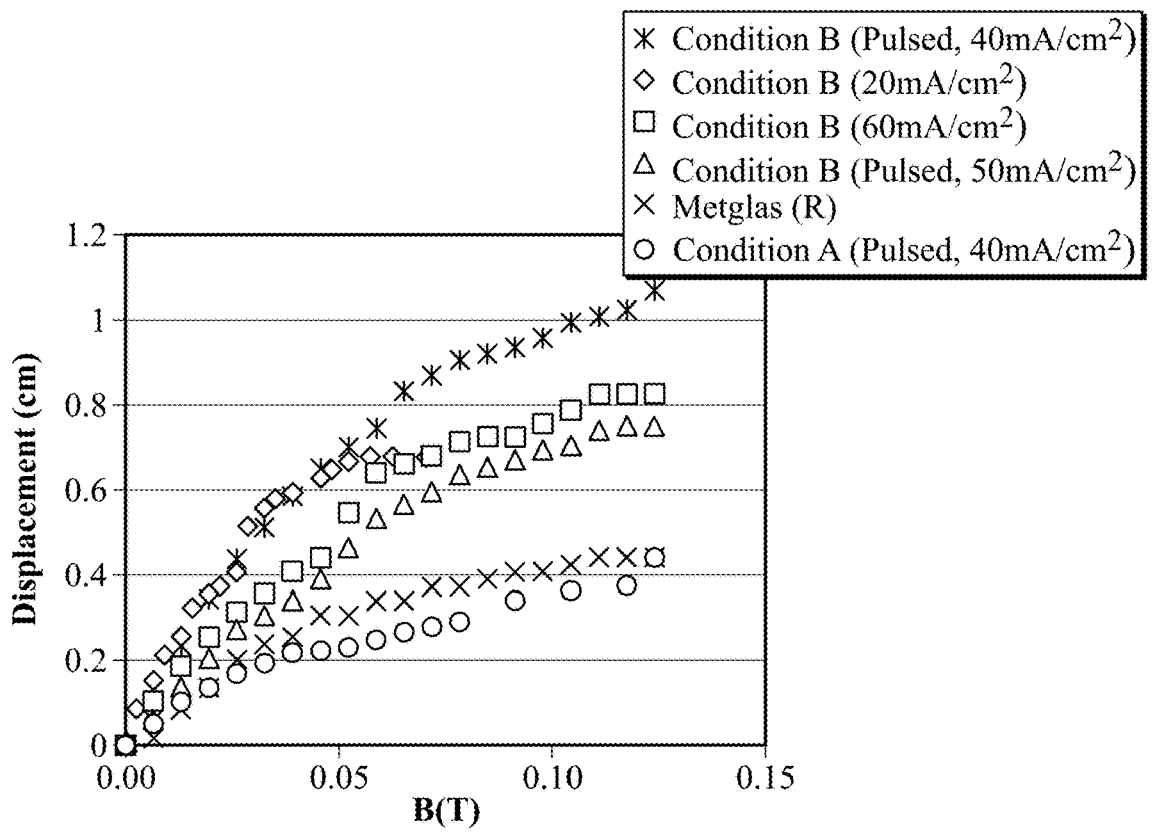
FIG. 16 shows magnetic testing for $Co_xFe_y$ films under various conditions, as described herein. Metglas® data are provided as control. Without wishing to be limited by this example, a sample formed using Condition B, described herein, and a pulsed deposition step (an "on" step of 40 mA/cm² for 3 seconds and an "off" step of 0 mA/cm² for 3 seconds at 220 cycles) provided an approximately 10 µm thick film having improved magnetostriction, as evidenced by a high displacement.
Figure 17:
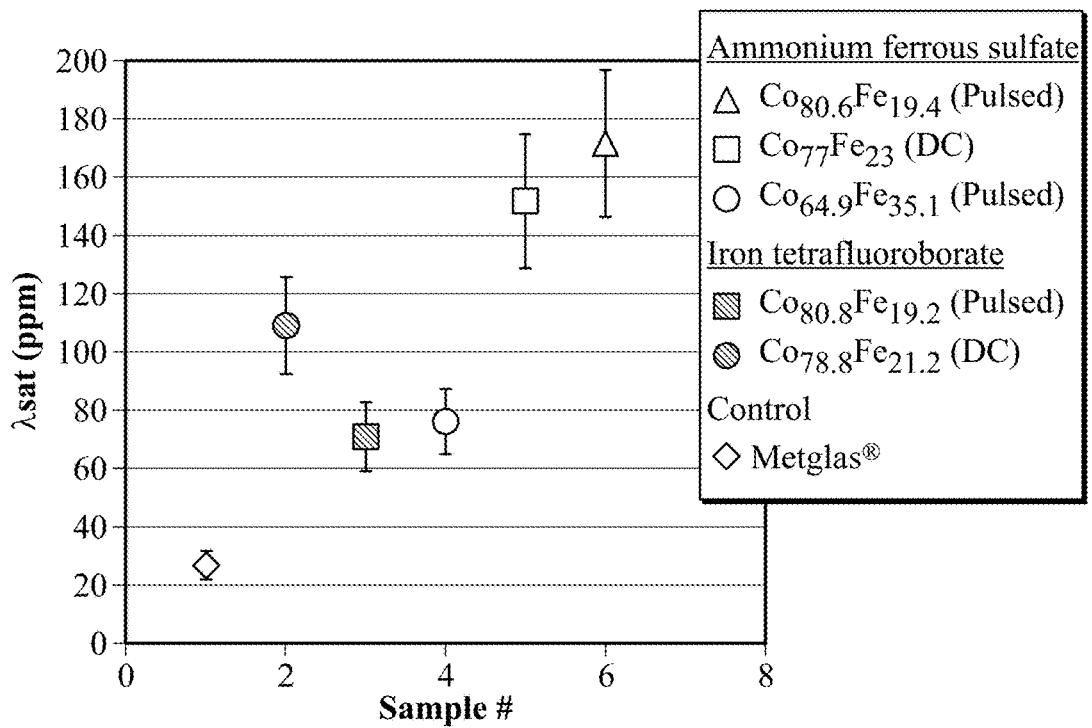
FIG. 17 shows $\lambda_{sat.}$ values for various $Co_xFe_y$ film samples formed using the methods described herein. Metglas® data are provided as control and show $\lambda_{sat}$ is about at 26±4 ppm within range of manufacturer's specified $\lambda_{sat}$ of 27 ppm.

Displacement data and $\lambda$ values were obtained. FIG. 16 provides displacement data for various samples prepared with Condition A or B, as indicated in the legend. FIG. 17 provides $\lambda_{sat.}$ values for $Co_xFe_y$ films prepared with Condition A (using iron tetrafluoroborate) or Condition B (using ammonium ferrous sulfate). Metglas® is provided as control. These data show the enhanced magnetic properties of the materials prepared by the methods herein. In particular, such displacement and $\lambda_{sat.}$ values were obtained prior to any post-deposition step, such as annealing or quenching. We previously reported a highest recorded $\lambda_{sat.}$ for electrodeposited films that was measured at 172±25 ppm (FIG. 17, data for $Co_{80.6}Fe_{19.4}$). However, more recent measurement have revised that value to about 78 ppm, which is comparable to that provided in Hunter et al., *Nat. Commun.* 2011; 2: article 518, for an as-deposited sputtered film (i.e., 84±5 ppm).

Example 5: Electrodeposition of a High Magnetostriction CoFe Film

We electrodeposited CoFe alloy films by employing novel chemistry onto copper test structures, thereby enabling magnetic displacement testing for magnetostriction calculations. Using a combination of additives that served as oxygen scavengers, grain refiners, and complexing agents in conjunction with a pulsed plating technique, CoFe films were synthesized at thicknesses as high as 10 μm with less than 8 at. % oxygen at a stoichiometry of 70-75% Co and 25-30% Fe. X-ray diffraction (XRD) analysis confirmed that these films had a crystal structure consistent with a 70% Co/30% Fe wairauite with a slight lattice contraction due to Co doping in the film. A novel characterization technique was used to measure the displacement of the CoFe films electrodeposited, as a function of applied magnetic bias, in order to determine the saturation magnetostriction ($\lambda_{sat.}$) of the material. With this chemistry and a tailored pulse plating regime, $\lambda_{sat.}$ values as high as 78 ppm were achieved.

The CoFe electrolyte was prepared from reagent grade cobalt sulfamate and ammonium ferrous sulfate salts. Trimethylamine borane (TMAB) and ascorbic acid were added as oxygen scavengers. Sodium saccharin salt and sorbitol were added as grain refiners and levelers for the deposited films. APY-17 was added as a surfactant and 5% by volume sulfuric acid was added to adjust the pH to 2.0. Full chemistry makeup, concentrations, and operating conditions are recorded in Table 2.

TABLE 2

Bath composition and operating conditions

| Chemicals | Concentration (mol/L) |
|---|---|
| $H_3BO_3$ | 0.5 |
| $Co(H_2SO_3)_2$ | 0.4 |
| TMAB | 0.1 |
| Sorbitol | 0.01 |
| Na saccharin salt | 0.05 |
| Ascorbic acid | 0.05 |
| $Fe(NH_4)_2(SO_4)_2 \cdot 6H_2O$ | 0.08 |
| Bath pH | 2.0 |
| Bath temperature | 50° C. |

All chemistries were sparged with $N_2$ for 30 minutes prior to use and kept under a bed of $N_2$ to minimize $O_2$ absorption and concentration in the bath. To determine the effect of the current density on the stoichiometric ratio of cobalt to iron, initial tests were performed using a Hull cell with a corrugated copper anode and a brass Hull cell plate as a cathode. The composition of the CoFe films was determined using an energy dispersive spectroscopy (EDS) system attached to a scanning electron microscope (SEM).

After the current density range was determined, the CoFe films were electrodeposited onto 97% Cu and 3% Fe deposit stress analyzer test strips from Specialty Testing and Development Co., Inc. (York, Pa.). Electrodeposition onto these substrates created a bimorph material that allowed for displacement measurements to calculate magnetostriction when placed in a solenoid. The Cu substrate was non-reactive in the applied magnetic field, while the positive magnetostrictive CoFe film elongates. With one end of the test strip fixed, the bimorph cantilever would bend; and the displacement was measured and used to calculate the magnetostriction.

Figure 18:
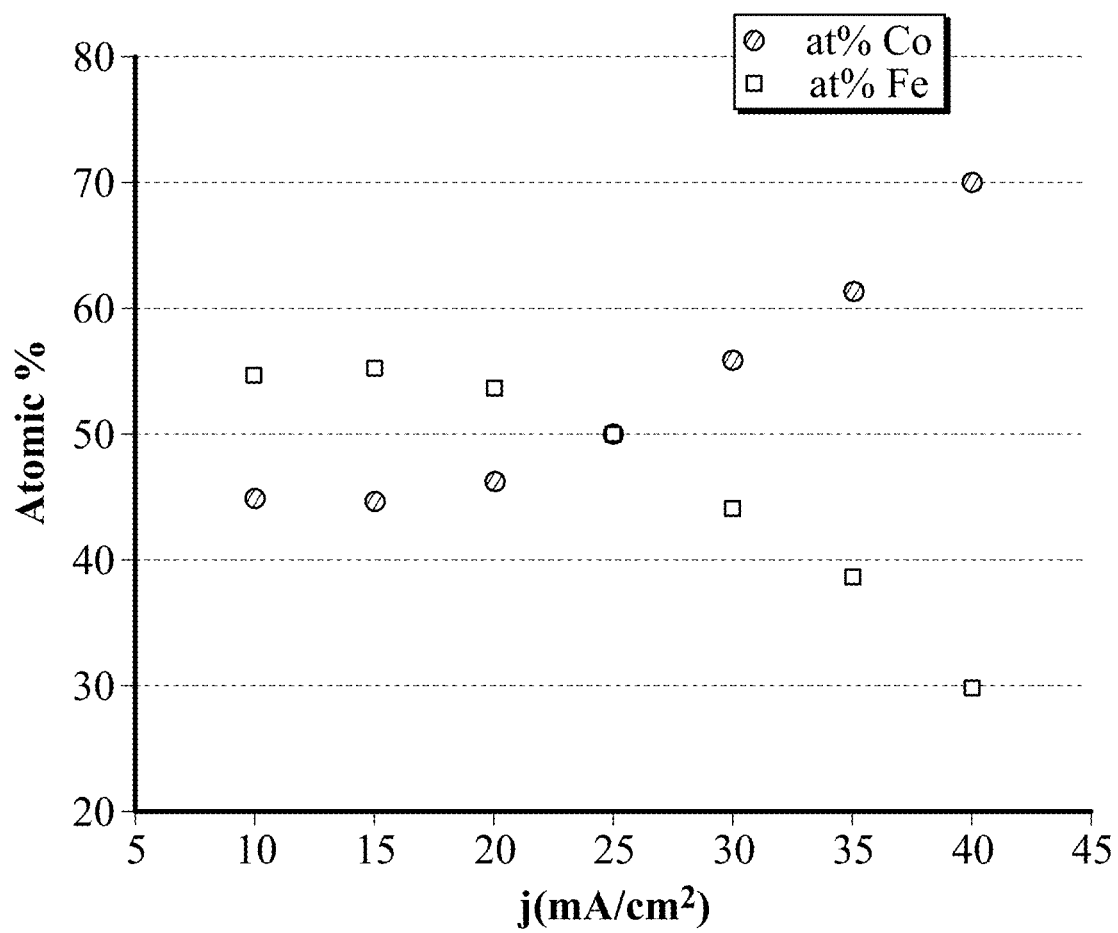
FIG. 18 shows a graph of stoichiometric ratio of cobalt to iron as a function of applied current density.

Initial experimentation was completed in a heated Hull cell at 50° C. to determine the optimal current density range to achieve the desired stoichiometric ratio of 70-75% Co to 25-30% Fe identified by Hunter et al., supra, as optimal for magnetostriction. At this ratio, the crystal structure is close to the (fcc+bcc)/bcc phase boundary where precipitates of a Co rich fcc phase are embedded in an Fe rich bcc phase. EDS results, only looking at Co and Fe, were graphed as a function of the current density as seen in FIG. 18. During DC plating, a current density of 40 mA/$cm^2$ gave the desired stoichiometry with a 0.4 M Co and 0.08 M Fe chemistry. When including the atomic percent of oxygen, the EDS analysis showed over 30 at. % oxygen. This was visibly evident from the dark and rough deposits showing the inclusion of $Fe(OH)_3$.

To control the oxidation of iron and the incorporation of oxygen into the electrodeposited film, oxygen scavengers as additives were incorporated into the chemistry. These additives are readily oxidized and also serve as reducing agents to move any $Fe^{3+}$ formed during the on cycle of the pulse back to a $Fe^{2+}$ state during the off cycle of the pulse. Earlier researches have reported good control of the oxygen content in deposited CoFe films using trimethylamine borane (TMAB) as an oxygen scavenger. As the concentration of TMAB was increased, the level of $Fe^{3+}$ formed was decreased. Unfortunately, higher levels of TMAB also led to the incorporation of boron into the deposit and a decrease in magnetic properties. Therefore, TMAB provided only a partial solution to the problems of Fe oxidation and the incorporation of oxygen into deposits and it could not be used in concentrations higher than ~100 mM.

An additional oxygen scavenger was used, in the form of ascorbic acid, and was added with the TMAB in the chemistry. This allowed for a lower concentration of TMAB to be used but still controlled the formation of ferric hydroxide during metal deposition.

Samples were DC plated over a range of current densities with the oxygen scavenger additives and the samples were analyzed with EDS. As noted in Table 3, less $Fe(OH)_3$ was formed and incorporated into the film at the lowest current density, but the ratio of Co to Fe could be further optimized. A drop in at. % of oxygen was measured on all films compared with previous deposition without additives, but a pulsed plating technique was needed to restore the cation concentrations and the pH in the interface to their bulk values and to further decrease the oxygen content.

TABLE 3

EDS results of DC plated samples with TMAB and ascorbic acid additives

| Current density (mA/cm$^2$) | At. % O |
|---|---|
| 20 | 8.6 |
| 30 | 17.1 |
| 40 | 15 |
| 50 | 15.3 |
| 60 | 14.3 |

Films analyzed with EDS, with varying "on" pulse times, showed that iron is kinetically faster and with short pulses the films will be iron rich. Due to slow diffusion and lower concentration, the iron is quickly limited in the interfacial region based on the concentration profile at the interface calculated from the diffusion coefficient as a function of time. So a longer pulse time favors a more Co rich film, but the pulse time is limited by formation of $Fe(OH)_3$ due to the local rise in pH from the hydrogen evolution reaction.

Although a shorter pulse mathematically will work, a pulsing regime of three seconds "on" at 40 mA/cm$^2$ and three seconds "off" at 0 mA/cm$^2$ was calculated to allow for the concentration of iron and the local pH to restore to the bulk values. An evaluation of the potential as a function of time during pulse plating shows a restoration to the open circuit potential at the end of the 3 second "off" time and EDS analysis of pulse plated samples consistently showed less than 8 at. % oxygen, a reduction of approximately 7-7.5 at. % compared with the DC plated sample at 40 mA/cm$^2$.

Figure 19:
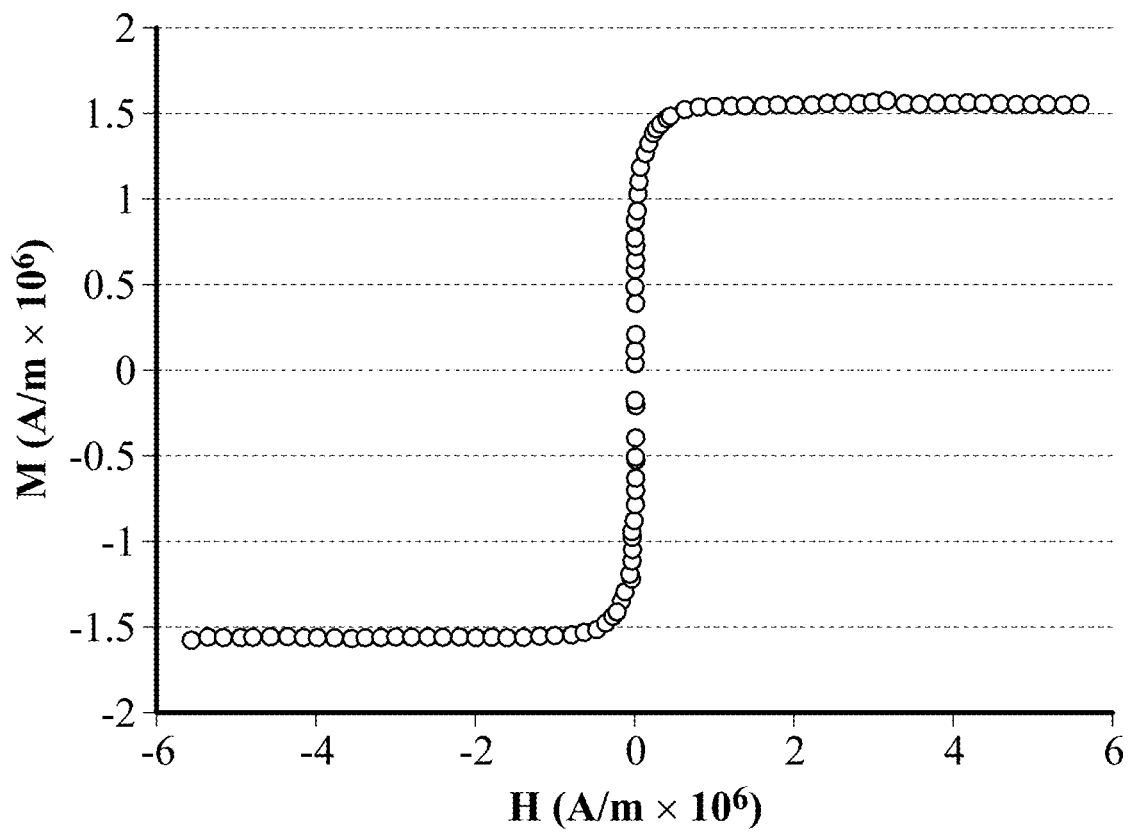
FIG. 19 shows a magnetic hysteresis loop for a pulse plated CoFe film.

A hysteresis loop (FIG. 19) of a pulsed sample was formulated from SQUID measurements to examine the magnetic properties of the CoFe films. A magnetic saturation ($M_{sat.}$) of $1.57 \times 10^6$ A M$^{-1}$, a low coercivity of 4351 A m$^{-1}$, and an initial permeability of 87.5 were calculated from the asymptotic end point values and the intersection of the x-axis on the hysteresis plot. A low coercivity equates to a low anisotropy field, which will increase the strain sensitivity and the value of the magnetomechanical coupling factor.

XRD analysis confirmed that these films had a crystal structure consistent with 70% Co/30% Fe wairauite. Two phases were evident, namely Cu from the substrate, and the bcc CoFe alloy. The data required some unit cell contraction to align the standard peak locations to that of the observed reflections. The Cu peaks in the data were used to correct for any sample displacement error in the sample. Plotting the lattice parameter for different compositions as a function of the mole fraction of Co in the $Co_xFe_{1-x}$ alloy, the measured lattice parameter of 2.8355 Å for the pulsed film, indicated an alloy of approximately 85% Co by Vegard's Law. EDS analysis measured a composition of 73.5% Co, 18.44% Fe, and 7.98% O.

The observation of a slightly higher Co content for the alloy via XRD as compared to EDS analysis can be explained by the preferential oxidation of Fe during electrodeposition. The formation of a small (likely nanocrystallite) iron oxide and iron hydroxide during synthesis serves to reduce the iron concentration available to form the Co—Fe alloy. This resulted in the biasing of the alloy toward higher molar ratios of Co as observed by XRD in comparison to the Fe:Co ratio obtained from EDS analysis.

Figure 20:
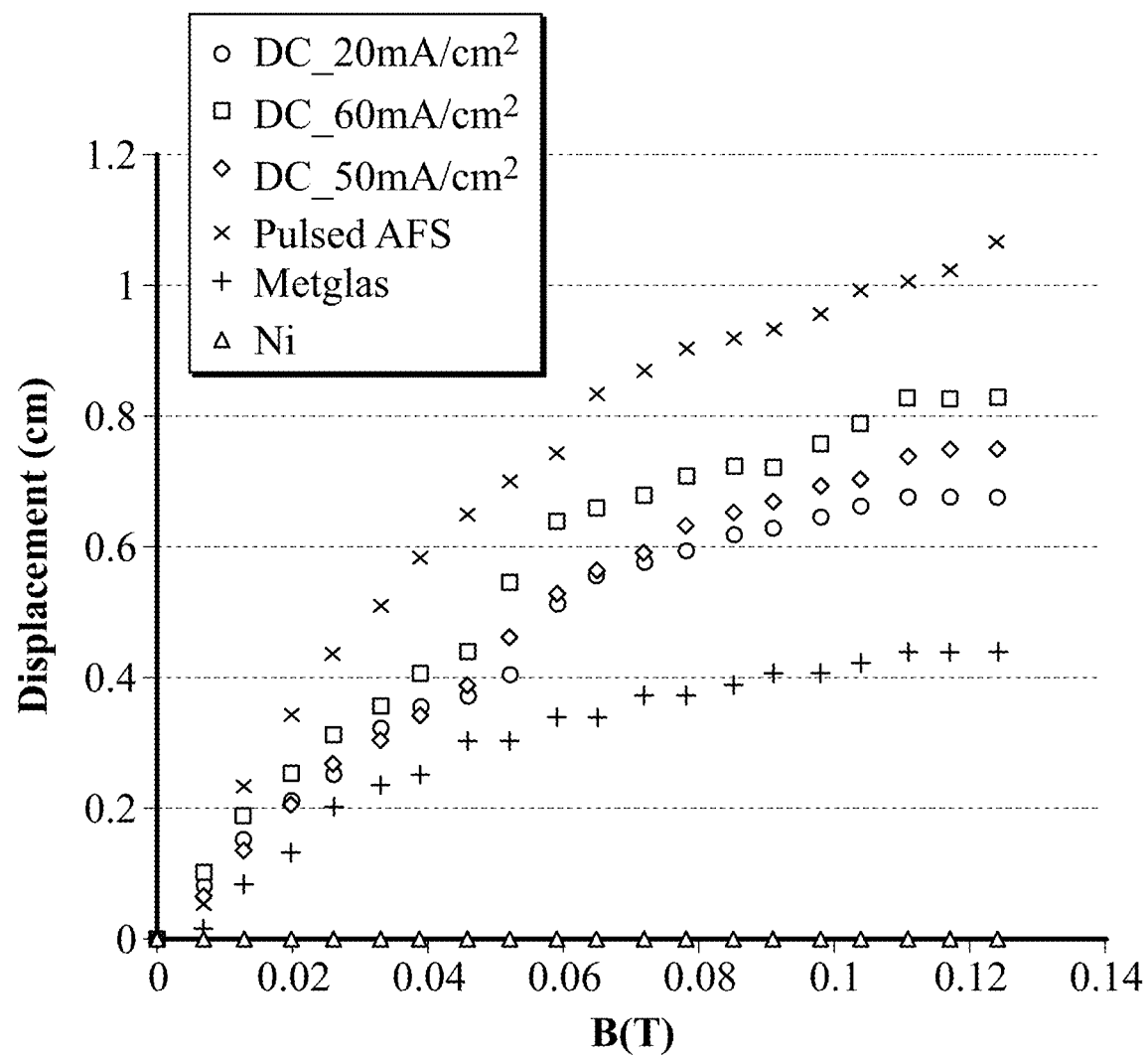
FIG. 20 shows a graph of displacement measurements from solenoid testing.

Next, samples were made for displacement testing in a solenoid using the pulsing regime and chemistry makeup. A comparison of displacement measurements from representative samples DC plated over different current densities and a pulse plated sample are seen in FIG. 20.

A saturation magnetostriction measurement was derived from the displacement.

Films of our material have demonstrated saturation magnetostriction values $\lambda_{sat.}$ as high as 78 ppm, which surpasses the values exhibited by at least some commercial materials.

In summary, electrodeposition of a CoFe alloy film with an oxygen content of less than 8% and a stoichiometric ratio of between 70-75% Co to 25-30% Fe was achieved using a combination of oxygen scavengers and a pulsing regime to allow for the dissolution of ferric hydroxide formed during metal deposition. This combination saw a drop in the oxygen content of over 22 at % and a crystal structure consistent with CoFe bcc wairauite alloy with a slight unit cell contraction. These films had a calculated $M_{sat.}$ of $1.57*10^6$ A m$^{-1}$ and low coercivity of 4351 A m$^{-1}$. Magnetostriction measurements of as-deposited CoFe alloy films were measured with saturation magnetostriction as high as 78 ppm.

Electroformed MEMS Variable Capacitor

We have developed a new MEMS variable capacitor that incorporates electroformed mechanical and electrical features and an electrodeposited CoFe-based alloy film. (By "CoFe-based" we mean composed of CoFe with or without additional elemental components.)

Modeling studies based on our current design predict a variable capacitance range up to 3 pF, actuated with microstrains up to 200 ppm. (A "ppm" is a part per million.) We believe that still greater ranges could be achieved by deploying multiple devices in parallel, by increasing the area of the capacitor plates, or by reducing the gap spacing between them. As those skilled in the MEMS art will appreciate, however, there are design tradeoffs because reducing the gap spacing can reduce the dynamic range, and increasing the plate area can lead to stiction between the capacitor plates.

More broadly, we believe that using our approach, a variable capacitance over at least the range 1-5 pf can be achieved.

We have also developed a new process for fabricating the variable capacitor, among other things. This process makes use of a technique of planar layering. That is, successive oxide layers are processed to form sacrificial regions and to form electroplating molds. The electroplating molds are filled with deposited metal and in at least some cases processed further to present planar surfaces for subsequent growth and deposition.

It should be noted in this regard that ideally, the electrodeposition alone would produce a metal fill that reaches a level flush with the face of the mold. However, this is not always feasible in practice because of a tendency to grow ragged features near the edges of the mold that can sometimes project above the face of the mold. As a consequence, an additional step of chemical mechanical polishing (CMP) is sometimes desirable in order to remove the projecting features and produce a surface that is flush to within a tight tolerance such as a tolerance of several nanometers.

Our new process can be applied to produce an electrochemically fabricated cantilever structure with an integrated magnetostrictive sensing element.

As noted, such a structure can be used to implement a variable capacitor. More broadly, we have developed a magnetoelastically actuated device. By way of example and without limitation, such a device also has potential applications as an electrical switch, as an optical deflector in an optical switch or the like, and as a sensor in a gauge for measuring magnetic fields.

In some implementations, the range of capacitances over which the device operates can be tuned by adding an external or internal magnetic field source.

In one example of a magnetic field gauge, the instantaneous capacitance constitutes the signal indicative of field strength. In another example, the MEMS structure is implemented as a magnetoelastic switch that is replicated multiple times with each instantiation closing at a different field strength. In such an implementation, the pattern of switch closures provides the signal indicative of field strength. In yet another example of a magnetic field gauge, the magnetoelastically induced capacitance change or switch closure is augmented by a force applied by an electrostatic actuation electrode, and the actuating voltage provides the sensor signal.

Illustratively, we will refer to our new device, below, as a variable capacitor. However, it should be borne in mind that this is only a non-limiting example and that the scope of the invention includes magnetoelastically actuated devices for other applications as well.

We refer to the magnetoelastically actuated element in our device as a laminar magnetic actuator because it is constituted by two or more layers of different materials, at least one of which deforms in a magnetic field.

The laminar magnetic actuator is placed at a standoff distance from a base surface so that there is a separation between the actuated element and a capacitor plate on the base surface. Bending of the actuated element changes the capacitance by varying the separation. An example standoff distance is 1 µm. However, a range of standoff distances is believed feasible, for example 0.5-2 µm.

In implementations, the magnetoelastically actuated element in our device is a bimorph cantilever. That is, it is a cantilever-supported beam or other structural element in which a layer of magnetostrictive material overlies and is essentially contiguous with an underlying material, which we refer to as the "structural layer", that exhibits essentially no magnetostriction. By "essentially contiguous" is meant that any intervening material is too thin to measurably affect the mechanical properties of the element. By "essentially no magnetostriction" is meant either zero magnetostriction or magnetostriction that is so weak that it does not measurably affect the magnetoelastic response of the element.

In current implementations, the film of magnetostrictive material is thinner than the underlying structural layer, although that limitation is not believed to be critical. In order to have a good dynamic range, i.e. a relatively large deflection at the saturation field, the material of the structural layer should not be too stiff.

As is known in the art, bending of typical bimorph cantilevers is usually optimized when the two layers have the same thickness and Young's modulus. In our implementations, however, we have obtained best results when the structural layer has a Young's modulus that is somewhat smaller than the Young's modulus of the magnetostrictive material.

We have found that copper is a particularly advantageous material for the structural layer because it readily accepts electrodeposited metal and because it has a Young's modulus that is smaller, but not too much smaller, than that of useful CoFe compositions.

Our currently preferred composition for the magnetostrictive film is CoFe, that is, copper-iron alloy without other intentional alloying elements, but not excluding additives incidentally included from the electroplating bath. CoFe is preferred because to date, it has been found to offer the highest magnetostriction. As noted above, however, other compositions, such as CoFeB compositions, may be useful for at least some purposes and are not excluded.

An example thickness for the CoFe layer is 2 µm. More generally, thicknesses in the range 0.5-5 µm are believed to be effective. For particular applications, thicknesses outside this range may also be useful.

In an example, the bimorph consists of a 2-µm-thick CoFe layer overlying a copper structural layer 9 µm thick. In operation, an applied magnetic field causes the CoFe layer to elongate in proportion to the strength of the applied field. Meanwhile, the copper will resist elongation. The strain that is produced will cause the cantilever to deflect downward, thereby decreasing the capacitor gap spacing and increasing the capacitance signal.

Figure 21:
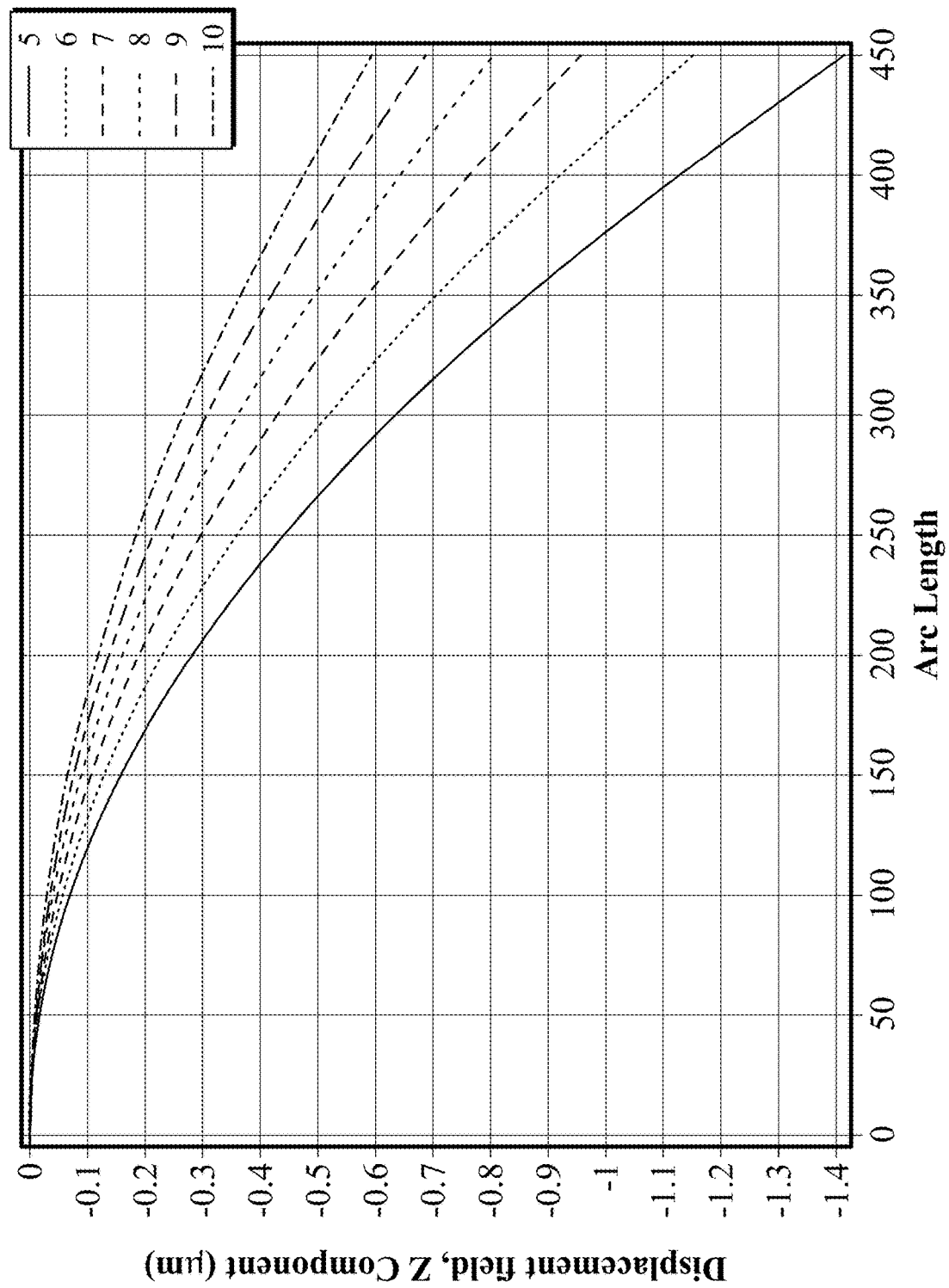
FIGS. 21 and 22 are graphical results of numerical modeling studies aimed at optimizing a design for a cantilever arm of a MEMS variable capacitor device as described herein.
Figure 22:
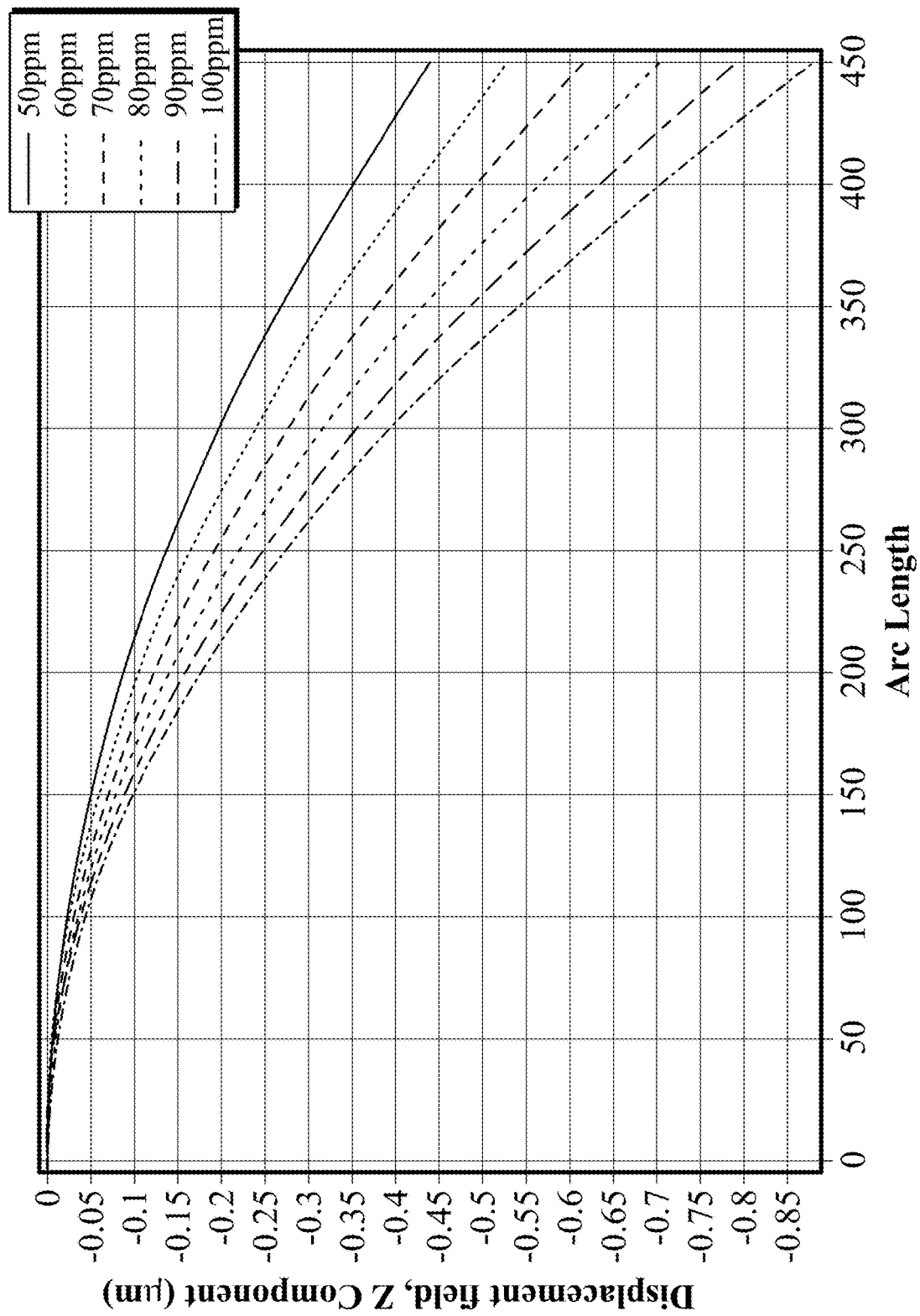

FIGS. 21 and 22 are graphical results of numerical modeling studies aimed at optimizing the thickness of the copper structural layer under various scenarios. In this example, the saturation magnetostriction is assumed to lie within the range 50-100 ppm. More broadly, however, we believe that saturation magnetizations anywhere in the range from 1 ppm to 100 ppm would be suitable for the purposes described here.

For a designed 1-µm maximum capacitor gap, the vertical deflection (i.e. deflection in the z-direction) of the tip of the cantilever at saturation must not exceed 1 µm. This deflection depends on the copper thickness.

Accordingly, FIG. 21 is an illustrative graph of vertical displacement as a function of arc length for copper thicknesses of 5-10 µm in increments of 1 µm. The arc length is a measure of the bending of the cantilever. The assumed saturation magnetostriction in FIG. 21 is 78 ppm. The range of 5-10 µm for the copper thickness is a non-limiting example. More generally, for CoFe thicknesses in the range 0.5-5 µm, suitable thicknesses of the underlying copper will be in the range 0.5-20 µm.

Similarly, FIG. 22 is a graph, from the same study as FIG. 21, of the vertical displacement as a function of arc length at a fixed copper thickness of 9 µm, but for saturation magnetostriction values ranging from 50 ppm to 100 ppm in increments of 10 ppm.

Figure 23A:
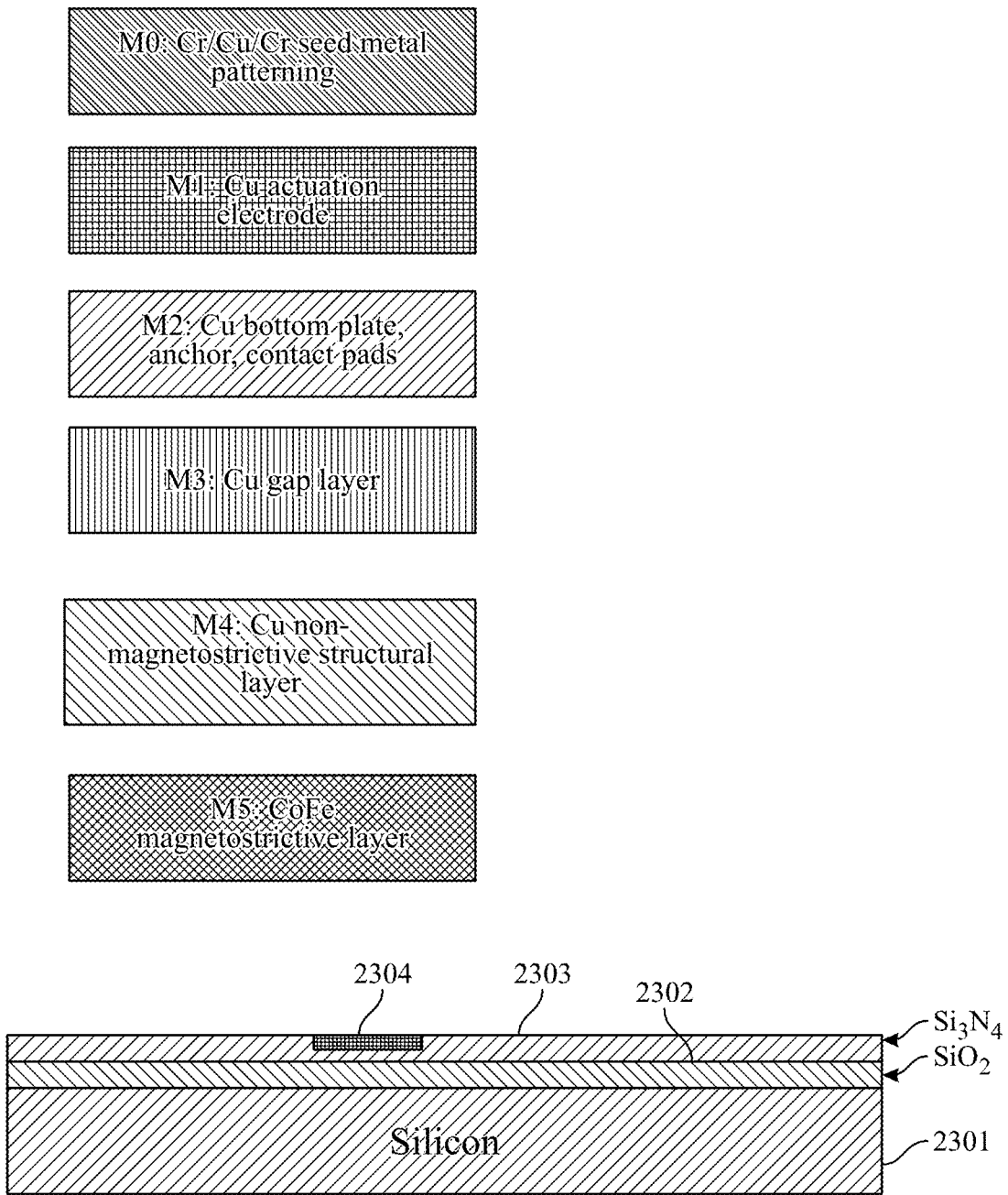
FIGS. 23A-23F illustrate sequential steps in an example process for fabricating a MEMS variable capacitor device as described herein.

FIGS. 23A-23F illustrate sequential steps in an example process for fabricating a MEMS variable capacitor device as described above. FIG. 23A includes a legend indicating the shading the identifies each of the six metallization levels M0-M5 that are shown in the figures:

M0 is Cr/Cu/Ti seed metal.

M1 is metal for the copper actuation electrode.

M2 is metal for the copper bottom plate, anchor, and contact pads.

M3 is metal for the copper gap layer.

M4 is metal for the copper cantilever structural layer.

M5 is the magnetostrictive CoFe.

As will be seen, the process to be described differs in several important respects from the method 900 previously described with reference to FIG. 10.

For example, the actuation electrode 915 according to method 900 is formed on the upper surface of the final dielectric layer 913, and then buried within sacrificial dielectric layer 920.

By contrast, the actuation electrode according to the process below is deposited within a recess in the underlying dielectric layer so that its top surface is flush with the top surface of the dielectric layer.

Further, the description below introduces a step of encapsulating the deposited CoFe layer in copper for protection during subsequent processing.

The example fabrication process will now be described with reference to FIGS. 23A-23F. Although the example process begins with a silicon wafer, a different type of wafer, such as an SOI wafer, could be used instead. In fact, the substrate need not be silicon-based. Various alternatives are possible, including glass and plastic substrates, as well as substrates of other substrate materials known in the art, provided only that they can withstand the processing temperatures.

Process:

1. On a silicon wafer 2301, deposit 0.5 µm of silicon dioxide 2302, followed by 0.5 µm of SiN 2303. (FIG. 23A.)

2. Pattern the copper actuation electrode 2304 on a spun-on photoresist to create a window for etching partway into the SiN. (FIG. 23A.)

3. Etch the SiN to a depth of 0.1 µm. (FIG. 23A.)

4. Before removing the photoresist, deposit a blanket layer of 25 nm Cr/75 nm Cu by e-beam evaporation. This is the M1 metallization layer for the copper actuation electrode. (FIG. 23A.)

This metallization fills the 0.1-µm etched into the SiN so that its top is flush with the SiN. This maintains surface planarity, thereby facilitating a subsequent step of chemical mechanical polishing (CMP). In place of copper for the actuation electrode, other metals such as gold or platinum may be substituted, provided the substituted metal is sufficiently resistant to subsequent chemical etching.

5. Remove the photoresist. This will lift off the Cr/Cu film from everywhere except the copper actuation electrode. This step is optionally followed by CMP. (FIG. 23A.)

6. Deposit a blanket layer of 25 nm Cr/30 nm Cu/25 nm Ti (in that order) by e-beam evaporation. This is the M0 metallization layer, and it is a seed layer for the subsequent growth of the M2 metallization layer for the copper bottom plate and contact pads, and for the copper anchor for the cantilever. Later, it is referred to as the "bottom seed layer".

A copper spacer, here referred to as the "gap layer", will be deposited over the copper anchor to create a standoff gap between the cantilever and the substrate.

7. Pattern a spun-on photoresist to create a mask for etching the M0 bottom seed layer.

8. Wet etch the bottom seed metal M0.

9. Remove the spun-on photoresist.

Figure 23B:
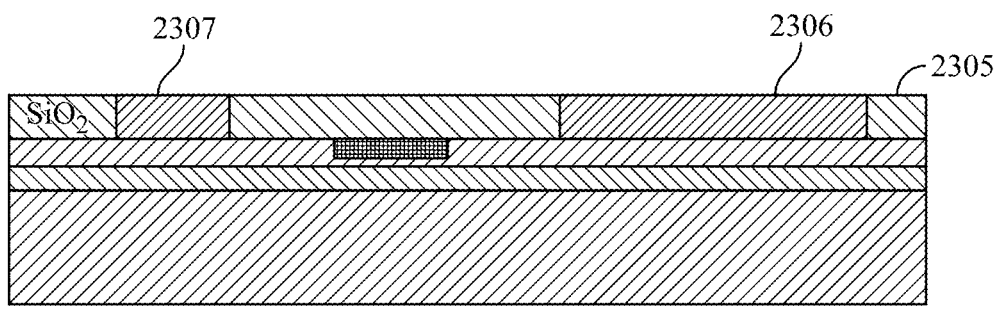

10. Deposit a 2-µm blanket layer 2305 of silicon dioxide by CVD. (FIG. 23B.)

11. Pattern a spun-on photoresist with the patterning for the copper M2 layer consisting of the bottom-plate electrodes and contact pads, and the anchor.

12. Through the patterned photoresist as an etch mask, etch the silicon dioxide down to the top titanium surface of the bottom seed layer (i.e. the M0 layer), and remove the titanium by wet etching, leaving a bilayer of copper over chromium.

13. Electrodeposit a 2-µm layer of copper. This is the M2 metallization layer. It forms the copper bottom plate electrodes and contact pads 2306 and the anchor 2307. The electrical contact to the two capacitor terminals is provided by this layer. (FIG. 23B.)

14. Remove the photoresist.

15. Perform CMP on the M2-level copper to planarize the electrode patterns.

Figure 23C:
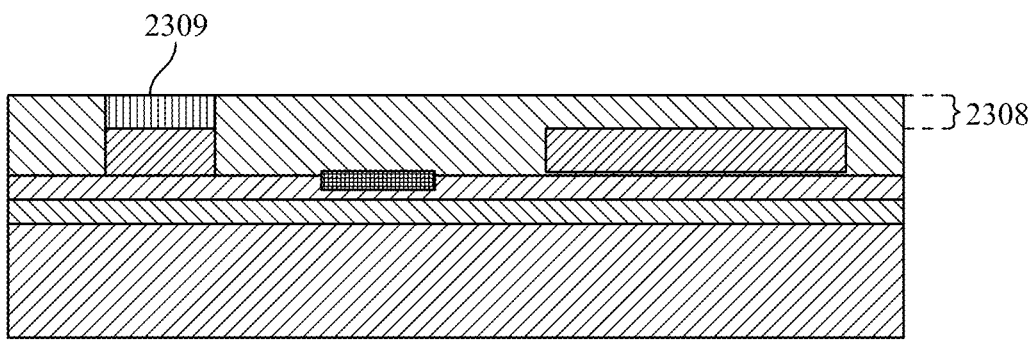

16. Deposit a 1.0-µm layer 2308 of silicon dioxide by CVD. This layer will overlie the oxide deposited in Step 10, and it will overlie the M2 copper features. This and the underlying oxide constitute a sacrificial oxide layer that will be removed to release the cantilever. (FIG. 23C.)

It should be noted in this regard that in alternative approaches, photoresist may be used as sacrificial material. However, we have found that an all-oxide sacrificial layer gives better results, and it is currently preferred for that reason.

17. Pattern a spun-on layer of photoresist with the patterning for the cantilever pedestal. The cantilever pedestal consists of the anchor, which has already been deposited, and the gap layer, which will be formed in the next metal-deposition step.

18. Etch a window through the silicon dioxide down to the copper electrode layer, i.e., to the M2 metallization.

19. Remove the photoresist.

20. Electrodeposit 1 µm of copper 2309 in the oxide window. This is the M3 metallization layer. It forms the gap-layer portion of the pedestal for the cantilever. (FIG. 23C.)

21. Blanket deposit a seed layer of 25 nm Cr/30 nm Cu/25 nm Ti by e-beam evaporation. Later, this is referred to as the "top seed layer". The M4 layer will be grown on this seed layer. The M4 layer is a non-magnetostrictive structural layer for the cantilever.

Although the M4 layer in this example is copper, other non-ferromagnetic metals or alloys can be used as an alternative, provided they have a sufficiently high Young's modulus.

Figure 23D:
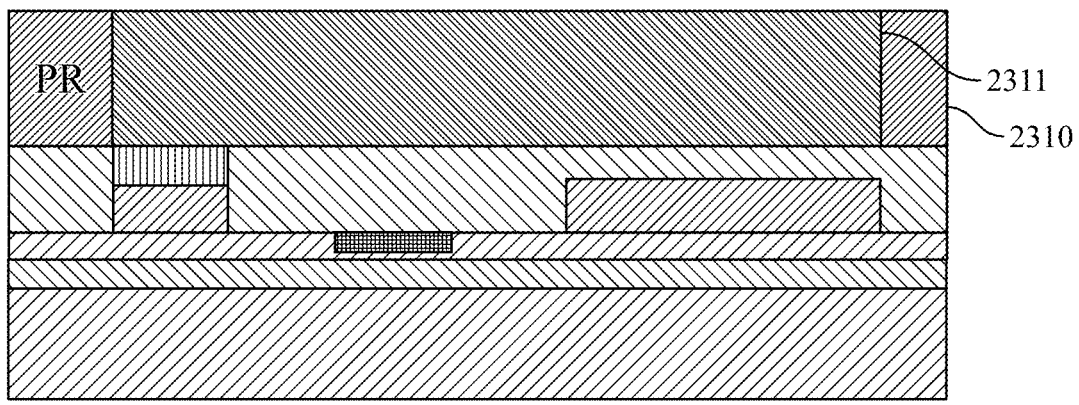
Figure 23E:
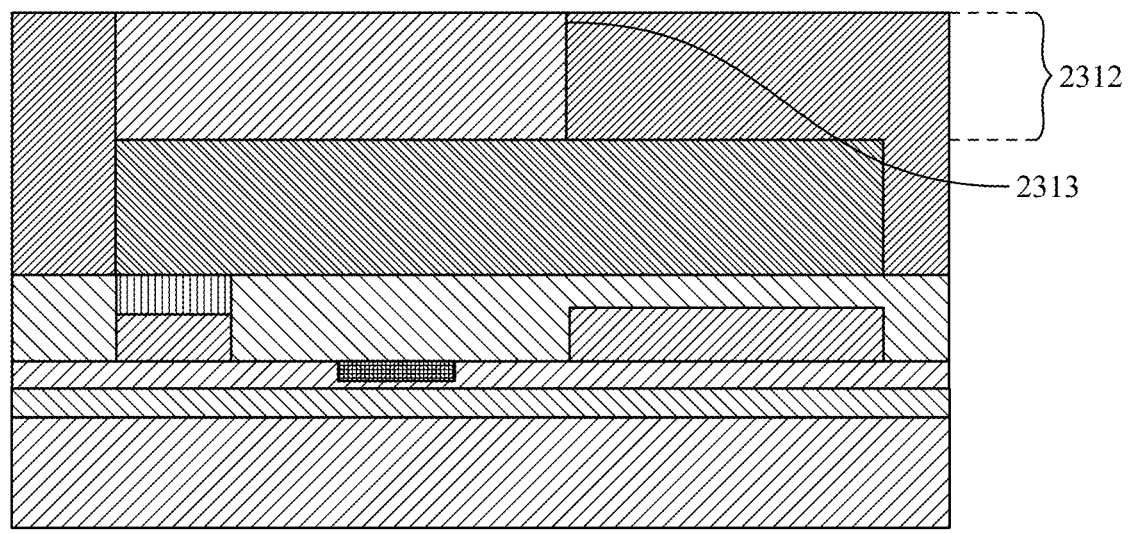
Figure 23F:
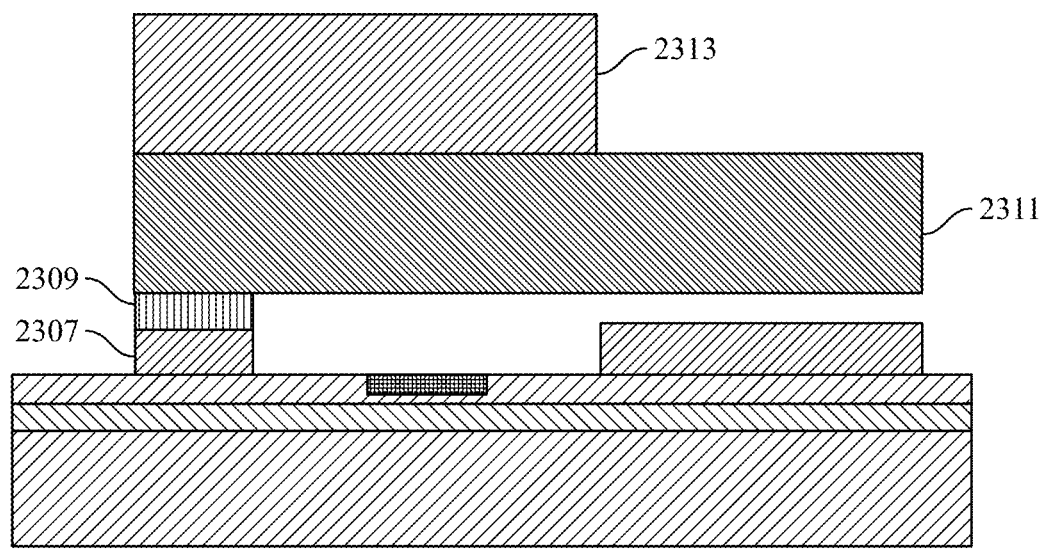

22. Pattern a spun-on AZ9260 photoresist layer 2310 (referred to below as the "cantilever photoresist") with the patterning for the cantilever. (FIG. 23D.)

Figure 26:
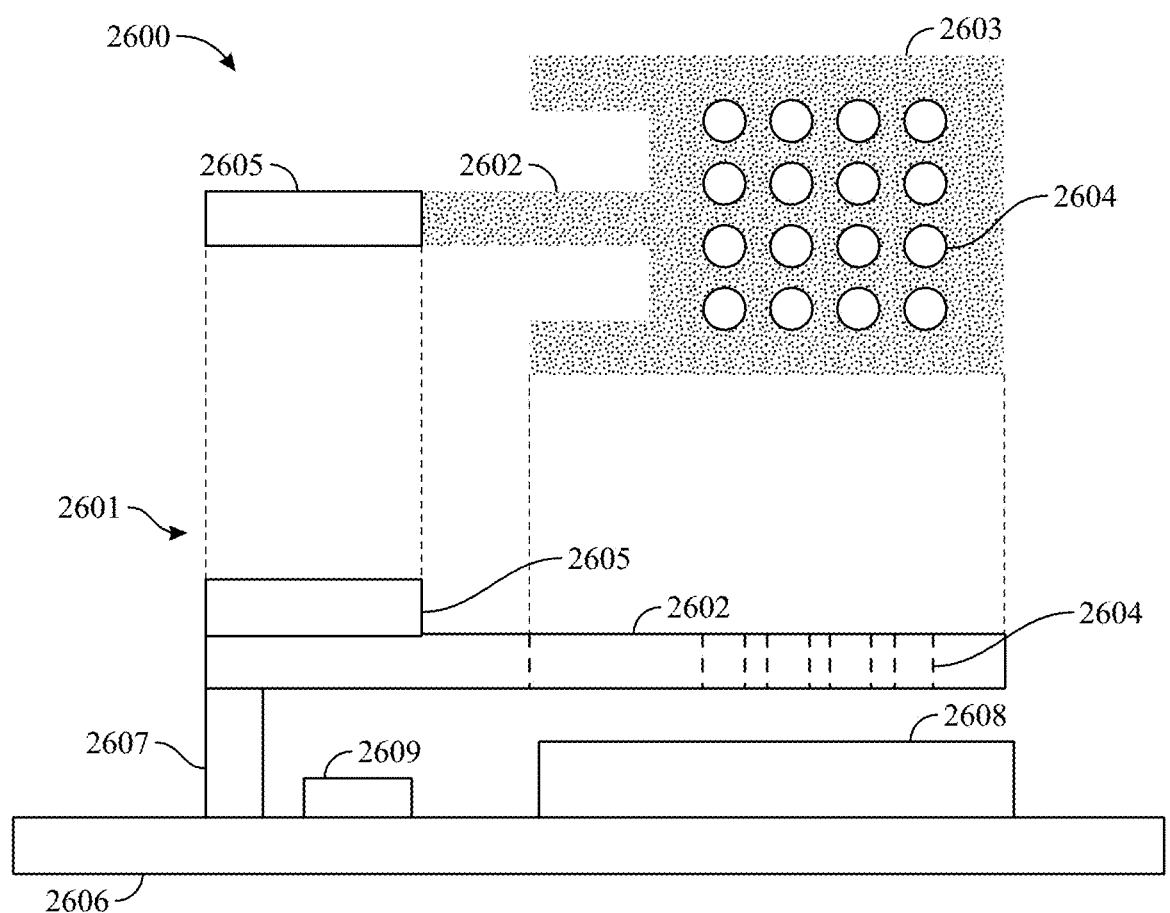
FIG. 26 notionally provides a plan view and an elevational view of the cantilever structural layer, as well as other portions, of an example MEMS variable capacitor device as described herein.

The patterned photoresist layer 2310 constitutes a mold for the cantilever structural layer. A plan view 2600 and an elevational view 2601 of an example structural layer are provided in FIG. 26. The figure is notional and not to scale. As seen in FIG. 26, the structural layer includes a flexible beam portion 2602 and an upper capacitor plate portion 2603. The capacitor plate is perforated with holes 2604. These are etch holes to admit etchant and facilitate the release process that is described below. The CoFe layer 2605 is also indicated in the figure. Also seen in the figure is the pedestal 2607 that supports the cantilever, the capacitor bottom plate 2608, and the optional electrostatic actuation electrode 2609.

It should be noted that the patterned photoresist layer 2310 includes vertical pillars of photoresist material to define the etch holes.

23. Electrodeposit 9 µm of copper 2311, using the patterned AZ9260 cantilever photoresist as a deposition mask. This is the M4 metal for the structural layer of the cantilever.

The figure of 9 µm is offered here as a nonlimiting example. In the design process, it will be typical to use numerical modeling to predict what thickness of copper will yield the best performance, given the desired magnetostriction range. (The magnetostrictive coefficient of a material, which can be positive or negative, is the fractional change in length of a bar of the material as its magnetization increases from zero to the saturation value beyond which no further change in length is produced.)

As noted above, a typical target value for the saturation magnetostriction $X_s$ would be in the range 1-100 ppm.

24. Remove the cantilever photoresist. Deposit a thin oxide layer on the M4 copper structural layer of the cantilever. This oxide layer encapsulates the entire cantilever structural layer, including the etch holes and including exposed portions of the underlying seed layer.

This oxide layer is intended to passivate the copper structural layer so that the encapsulating layer of copper to be deposited in Step 27, below, will form only over the CoFe actuation element. In particular, it is intended to passivate the edges of the etch holes so that they will not be closed off during the copper deposition in Step 27.

Spin on and pattern a layer 2312 of AZ4330 photoresist (referred to below as the "actuator photoresist") with the patterning for the magnetostrictive actuation element, which will overlie a portion of the structural layer of the cantilever. The patterning defines a mold and exposes the surface of the structural layer for growth of the actuation element.

25. Use a wet etch to open the oxide layer at the bottom of the mold, while leaving oxide on other portions of the cantilever structural layer. Electrodeposit a thin layer of copper, then electrodeposit 2 µm of magnetostrictive CoFe for the actuation element 2313. This is metallization layer M5. As with the copper thickness described above, the CoFe thickness of 2 µm is offered as a nonlimiting example. In practice, numerical modeling would typically be performed to predict what thickness of magnetostrictive material would give the best performance in the instant design.

It should also be noted that although our best results to date have been obtained using CoFe, alternative compositions in which cobalt and iron are alloyed with other chemical elements are not excluded.

26. Remove the AZ4330 actuator photoresist.

27. Electroplate a 0.5-µm coating of copper around and over the CoFe actuation element. This step leaves the CoFe actuation element completely encapsulated with copper, as its bottom surface is adjacent to the copper structural layer of the cantilever. The copper encapsulation is desirable because electrodeposited CoFe is highly reactive and will etch quite easily with most acids, bases and photoresist solvents commonly used in MEMS fabrication.

The copper encapsulation is protective of the CoFe because the copper can withstand long periods immersed in hydrofluoric acid (HF) that will be used to etch away the oxide sacrificial layer.

In subsequent steps, some or all of the electroplated copper encapsulant can be removed if desired.

Conversely, additional metal can be deposited over the copper encapsulant. For example, for applications in an optical switch, a specularly reflective surface can be provided by plating gold, platinum, or another noble metal over the copper encapsulant. More generally, any metal can be added, provided it will survive the hydrofluoric acid release bath described below.

A preferred etchant for removing the copper encapsulant (if so desired) is a non-aqueous etchant described in U.S. Pat. No. 5,304,284, "Methods for Etching a Less Reactive Material in the Presence of a More Reactive Material," which issued to F. Jagannathan et al. on Apr. 19, 1994, the entirety of which is hereby incorporated herein by reference.

An example etchant according to U.S. Pat. No. 5,304,284 includes a solution of cupric tetrafluoroborate in isopropanol at a concentration in the approximate range 2-10 grams per 80 mL. About 10 mL of triethyl orthoformate and about 10 mL of 2-butene 1,4 diol are added to the solution. Etchant solutions of this type were reportedly able to provide copper-to-cobalt selectivity ratios on the order of 200:1, with appropriate selection of etching bath composition.

Because of its high selectivity, the preferred etchant is able to remove the copper encapsulant without substantially affecting the CoFe film.

28. By wet etch, remove the Cr/Cu/Ti top seed layer deposited in Step 21. This step is desirable in order to prevent the shorting out of the cantilever or the underlying electrical traces by portions of the top seed layer. Although this wet etch could attack the copper encapsulant to some extent, the copper encapsulant can be made thick enough to maintain its integrity.

29. Etch away the sacrificial oxide with an HF etch to release the cantilever and expose the actuation electrode.

30. Etch away the Cr/Cu/Ti bottom seed metal using a wet etch or an ion mill. As with the top seed layer, it is desirable to remove the bottom seed layer to prevent electrical shorting. Although a wet etch could attack the copper encapsulant to some extent, the copper encapsulant can be made thick enough to maintain its integrity.

Removing the bottom seed layer is especially critical because this layer constitutes an electrical connection among all of the metal traces.

Figure 24:
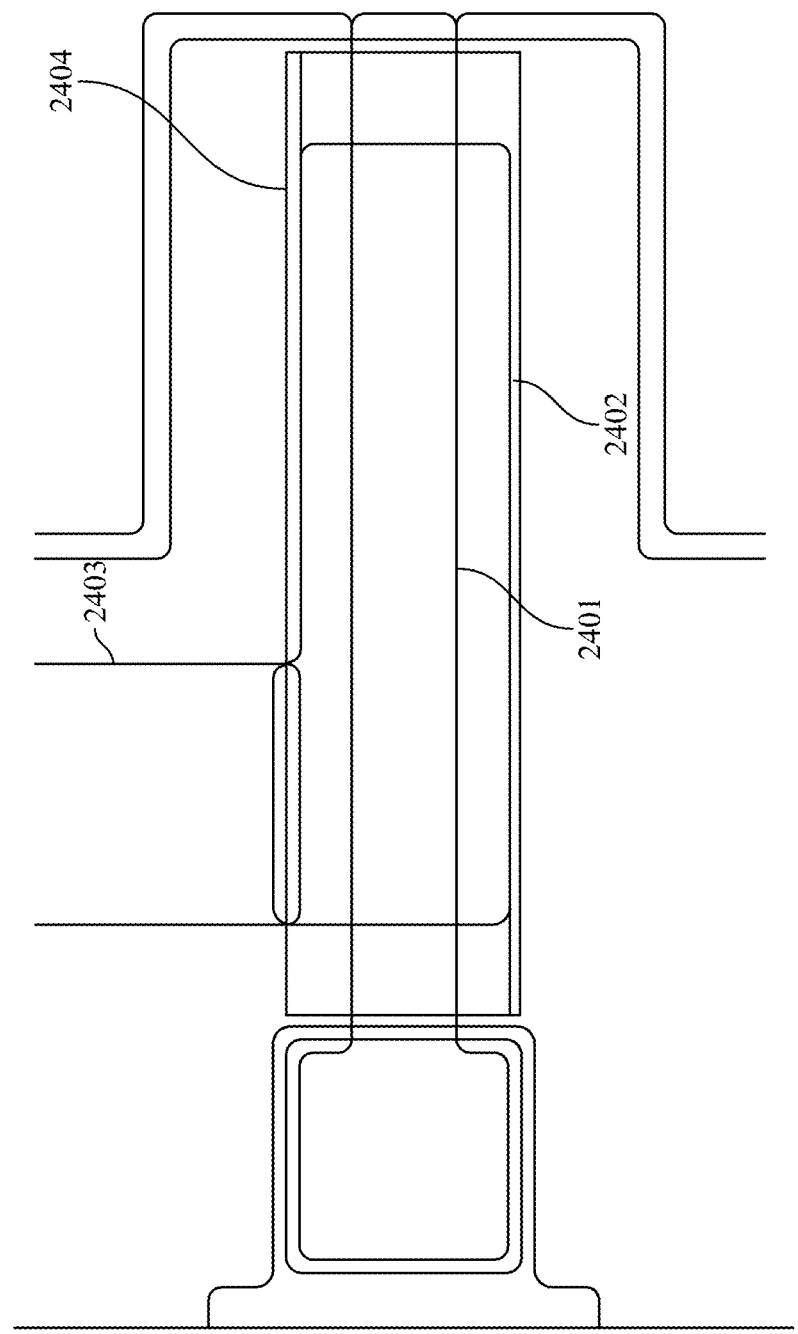
FIG. 24 is a line drawing, approximately to scale, indicative of some features of an example device made by the process of FIGS. 23A-23F.

FIG. 24 is a line drawing, approximately to scale, indicative of some features of an example device made by the above-described process. The figure is approximately to scale, and it is based on a mask layout for the device.

Indicated in the figure are illustrative footprints for the cantilever copper structural layer 2401, the copper actuation electrode 2402 in the M1 layer, the copper bottom-plate electrodes 2403 in the M2 layer for the capacitor, and the etch window 2404 for etching the M0 layer in order to electrically separate the actuator electrode from the other structures. Etch window 2404 is used, for example, when the bottom M0 seed metal is removed by ion milling.

Figure 25:
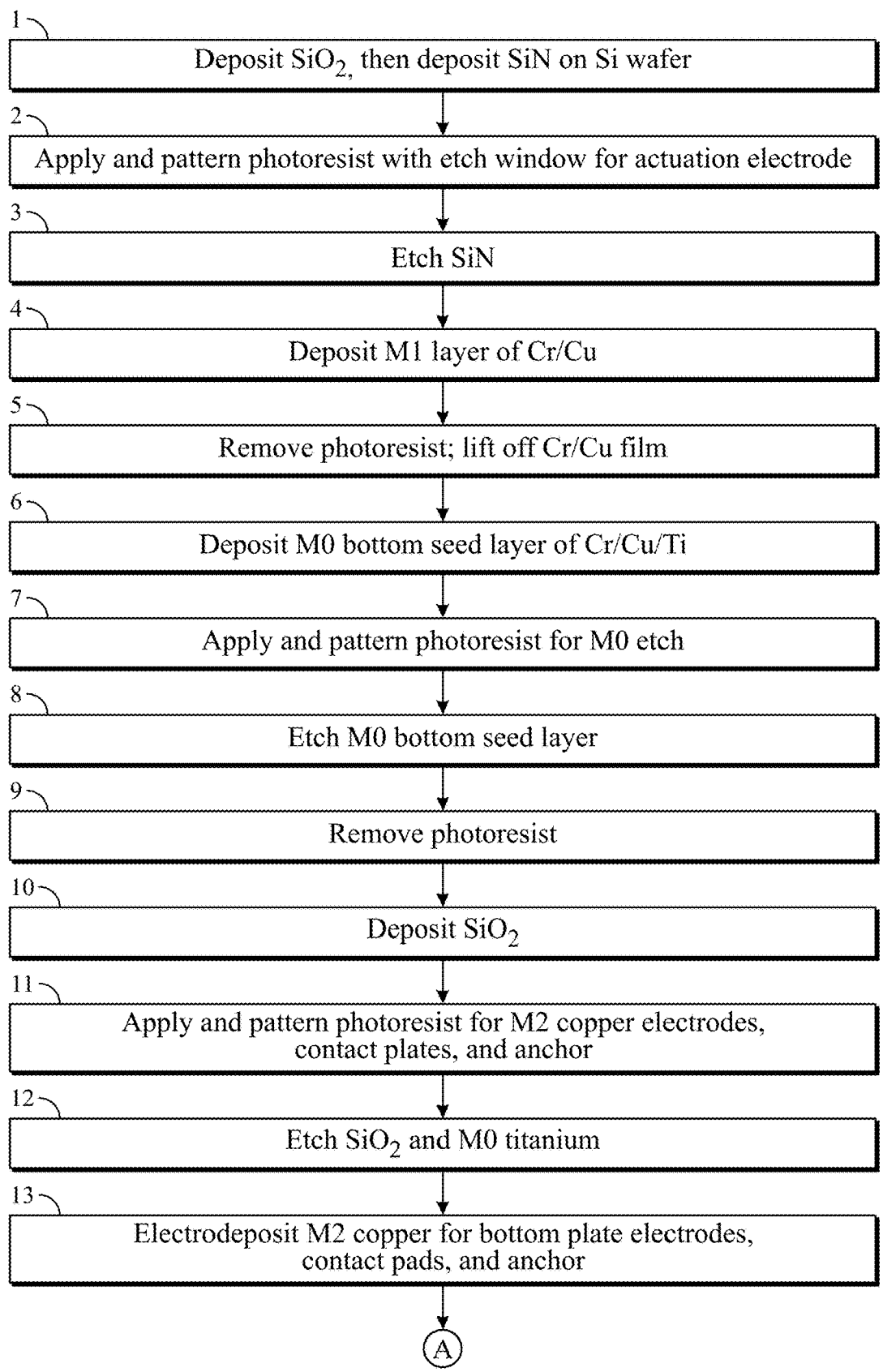
FIG. 25 is a flowchart of the process of FIGS. 23A-23F.
Figure 25:
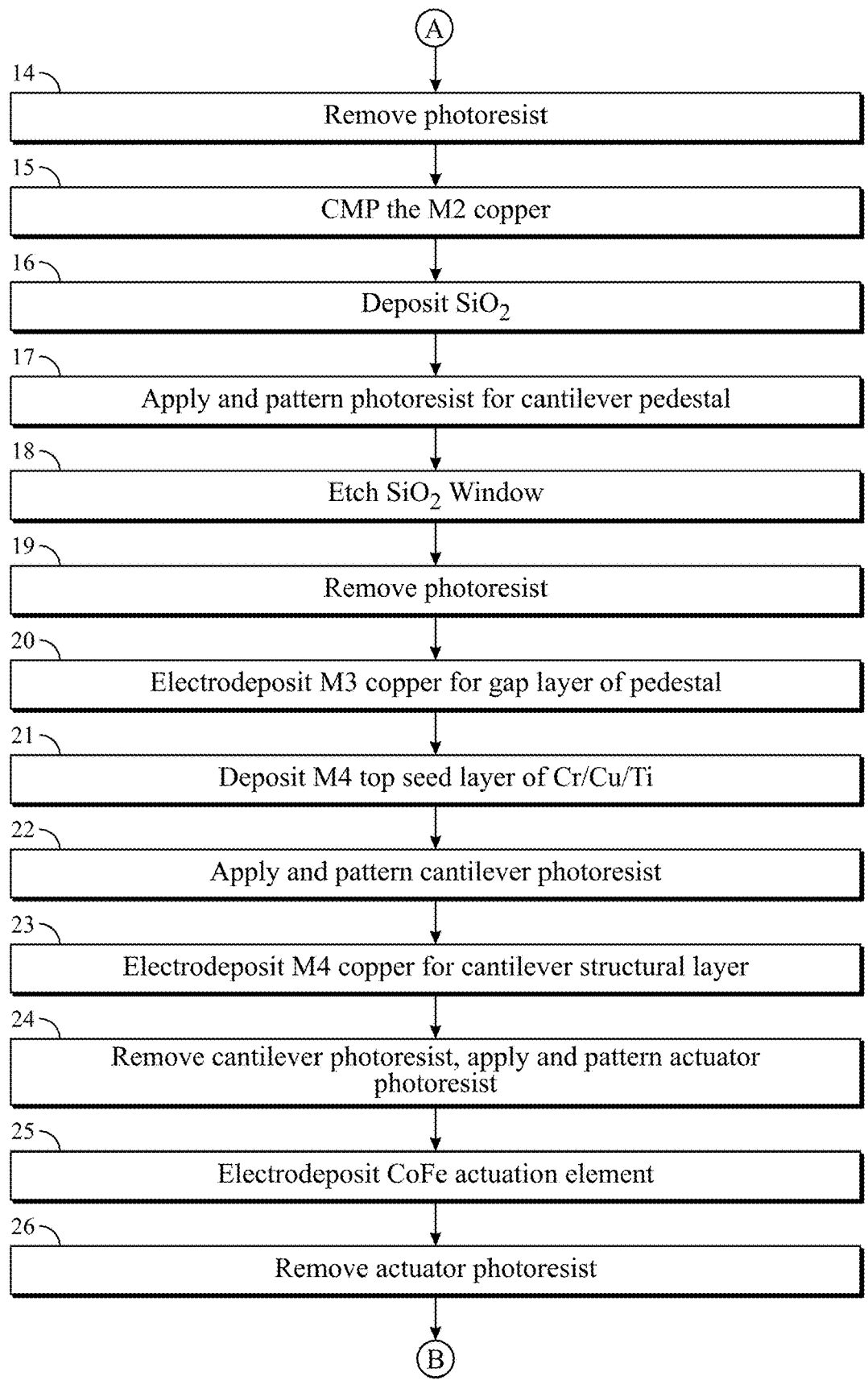
Figure 25:
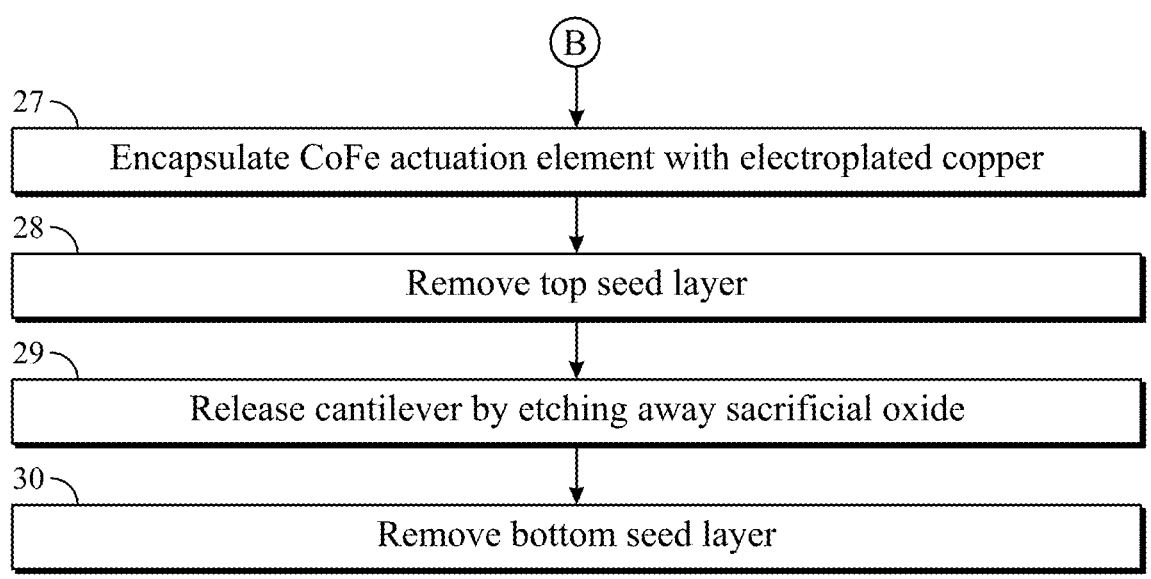

The thirty steps listed above are summarized in FIG. 25.

Turning again to FIG. 26, it will be seen that in the illustrated example, the capacitor top plate appears substantially greater in area than the flexible beam portion. In fact, we have found that when this is the case, the problem of finding an effective design is simplified because, except for the mass loading due to the capacitor plate, the capacitance is decoupled from the mechanical problem of a flexural beam.

That is, an example implementation has an upper capacitor plate about 1 mm$^2$ in area. By contrast, the corresponding flexible beam portion has dimensions of about 40 μm×400 μm, giving an area of about 0.016 mm². As a consequence, the bulk of the capacitance is due to the capacitor plates (the lower plate, in our example implementation, mirrors the upper plate in shape), and only a very small portion is due to the beam. Generally, this advantage will be enjoyed whenever the plate portion of the cantilever structure is at least 100 times greater in area than the beam portion.

Electrodeposition Process for CoFe

Example CoFe compositions were 70-80 at. % cobalt and 20-30 at. % iron

Our preferred electroplating bath for the CoFe film had a sulphamate chemistry. The iron sources were ammonium ferrosulphate and iron tetrafluoroborate. The electroplating process is described in detail above.

Iron tends to plate out of the bath faster than cobalt, even if it is present in lower concentrations in the bath. Hence to control the stoichiometry of the CoFe film, we operated the bath in a regime where the rate of iron deposition was mass-transport controlled.

The electric current for depositing the CoFe film was delivered in a train of galvanostatic pulses. We found that an effective current density is at least 20 mA/cm² and at most 50 mA/cm². Our lowest-stress films were obtained at a current density of about 40 mA/cm².

It is desirable to substantially exclude oxygen from the bulk material of the CoFe film. This was achieved by using two oxygen scavengers together in the plating solution, as described above. Efficient oxygen scavenging is especially desirable because it is an important factor in producing a film with very low stress gradient.

It was also desirable to produce films with a crystallographically highly isotropic morphology so that they would exhibit low magnetic coercivity. Specifically, it was desirable for the morphology of the films to be nanocrystalline or amorphous. A nanocrystalline material is a material having a grain size less than 100 nm. By careful control of our electrodeposition process, as described above, we were able to achieve grain sizes as small as about 20 nm.

Crystallographically, our preferred films were at the fcc-bcc boundary. That is, the CoFe alloy was predominantly in the bcc phase, but cobalt condensate was also present in the fcc phase.

In an example, the CoFe film was electrodeposited from an electroplating bath maintained at a temperature in the range 25° C.-60° C., having a selected pH in the range 2.0-3.5, and comprising a cobalt source, an iron source, one or more surfactants, one or more grain refiners, and a combination of oxygen scavengers consisting at least of trimethylamine borane and ascorbic acid. The temperature, the selected pH, the cobalt concentration, the iron concentration, the period and duty cycle of the galvanostatic pulse train, and the selected current density were selected to produce a film composition comprising 70-80 at. % cobalt and 20-30 at. % iron and having grains of CoFe alloy with a predominantly bcc crystal structure.

What is claimed is:

1. An apparatus, comprising:
   a substrate; and
   a microscale cantilever arm supported at a standoff distance from the substrate;
   wherein said arm comprises a laminar magnetic actuator configured to bend the arm when subjected to a magnetic field; and wherein:
   the laminar magnetic actuator comprises a film of magnetostrictive material;
   the laminar magnetic actuator is a magnetic bimorph comprising a structural layer of copper underlying and adjacent to the film of magnetostrictive material;
   the copper structural layer has a thickness in the range 0.5-20 μm; and
   the film of magnetostrictive material has a thickness in the range 0.5-5 μm.

2. The apparatus of claim 1, wherein the standoff distance is in the range 0.5-2 μm.

3. The apparatus of claim 1, wherein said film is electrodeposited and has a composition that comprises cobalt and iron.

4. The apparatus of claim 1, wherein the magnetostrictive material has a composition comprising 70-80 at. % cobalt and 20-30 at. % iron.

5. The apparatus of claim 1 configured as a variable capacitor, the apparatus further comprising a fixed electrode positioned on the substrate facing the cantilever arm, whereby a capacitance between the fixed electrode and the cantilever arm varies in response to bending of the cantilever arm.

6. The apparatus of claim 5, wherein the standoff distance, an area of the fixed electrode, and a moveable electrode area of the cantilever arm are configured to provide a capacitance that is variable over at least the range from 1 picofarad to 5 picofarads.

7. The apparatus of claim 1 configured as an electrical switch, the apparatus further comprising a fixed electrode positioned on the substrate, whereby contact between the fixed electrode and the cantilever arm closes a circuit in response to bending of the cantilever arm.

8. The apparatus of claim 1 configured as an optical switch, the apparatus further comprising a specularly reflective coating deposited on a surface of the cantilever arm distal the substrate, whereby a light beam reflected from the specularly reflective coating is deflected in response to bending of the cantilever arm.

9. The apparatus of claim 1, further comprising a magnetic source positioned in proximity to the laminar magnetic actuator so as to subject the laminar magnetic actuator to a magnetic bias field.

10. The apparatus of claim 1, wherein the substrate comprises a base layer of silicon.

11. The apparatus of claim 1, further comprising an electrostatic actuation electrode positioned on the substrate.

* * * * *